United States Patent [19]

Jennings, III

[11] Patent Number: 4,872,137

[45] Date of Patent: Oct. 3, 1989

[54] REPROGRAMMABLE CONTROL CIRCUIT

[76] Inventor: Earle W. Jennings, III, 965 Spadafore Ct., San Jose, Calif. 95125

[21] Appl. No.: 800,509

[22] Filed: Nov. 21, 1985

[51] Int. Cl.⁴ .......................... G06F 1/00; G11C 19/00
[52] U.S. Cl. .................................... 364/900; 377/69; 377/70; 377/73
[58] Field of Search ...................... 377/69, 70, 73, 77, 377/81; 364/900

[56] References Cited

U.S. PATENT DOCUMENTS 3,618,033 11/1971 Nordquist et al. ............... 377/69 X Primary Examiner—Raulfe B. Zache

[57] ABSTRACT

In the present invention, a reprogrammable control circuit is disclosed. The reprogrammable control circuit comprises a single-bit register for serially receiving an input bit signal and providing a control signal. The control signal represents the state of the bit stored in the register. A transmission gate means receives the control signal from the single-bit shift register and an input signal and provides an output signal therefrom. The control signal of the bit shift register is used to control the transmission of the input signal to the output signal. A plurality of reprogrammable control circuit which comprises a plurality of bit shift registers, each having a transmission gate means associated therewith is also disclosed. The reprogrammable control circuit can be used in an improved PLA, improved RAM, improved RCIM, improved ALU, improved counter, improved CAM, PCN to improve the reliability of routing signals and power, and to preserve the states of flip-flops. The improved digital control circuits can then be effectively integrated on a wafer scale.

26 Claims, 27 Drawing Sheets

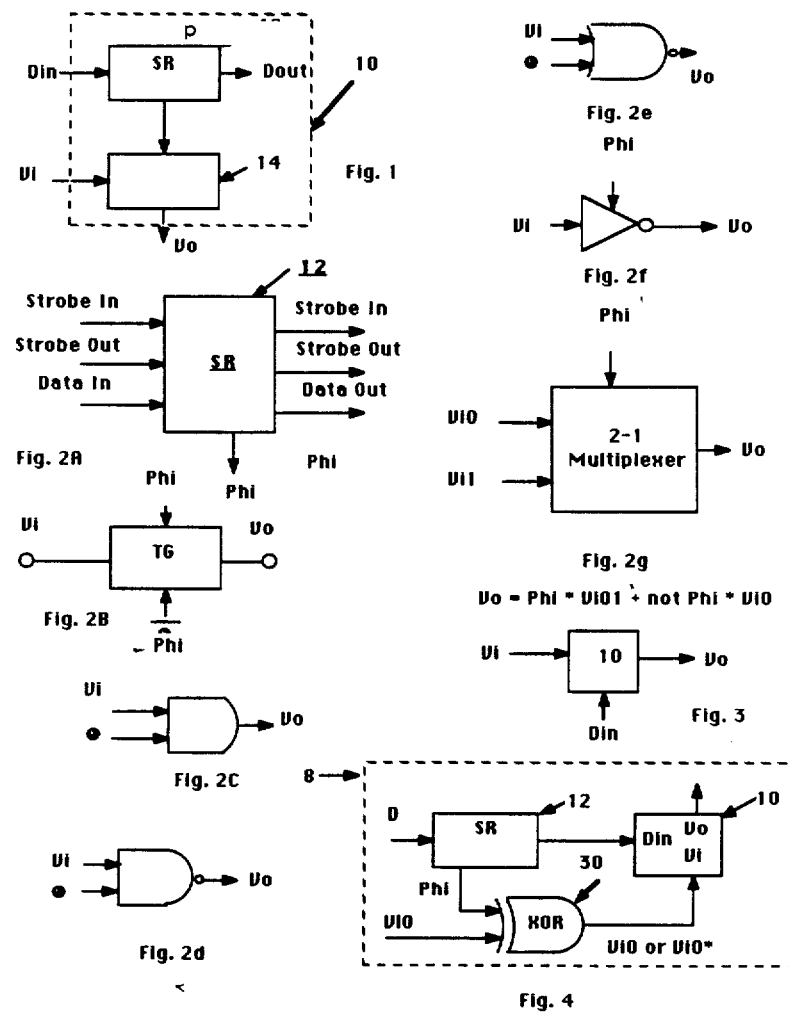

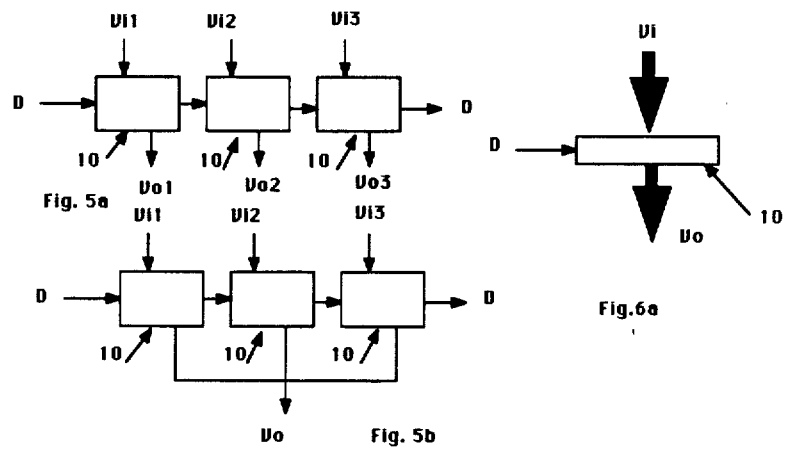
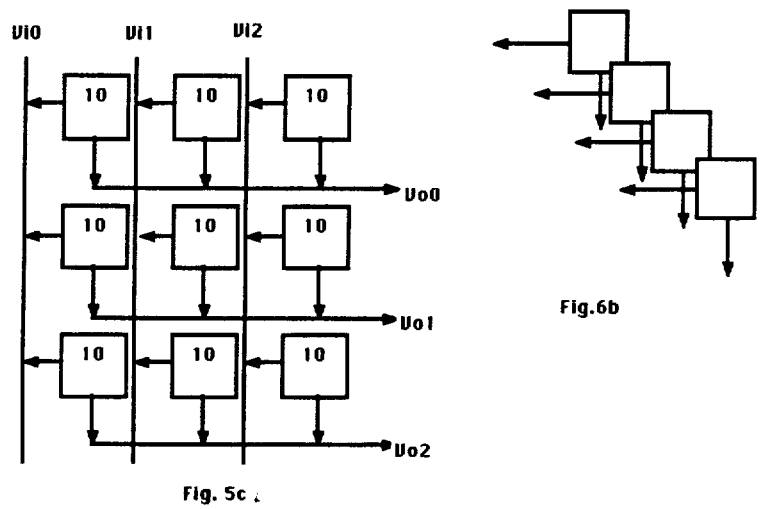

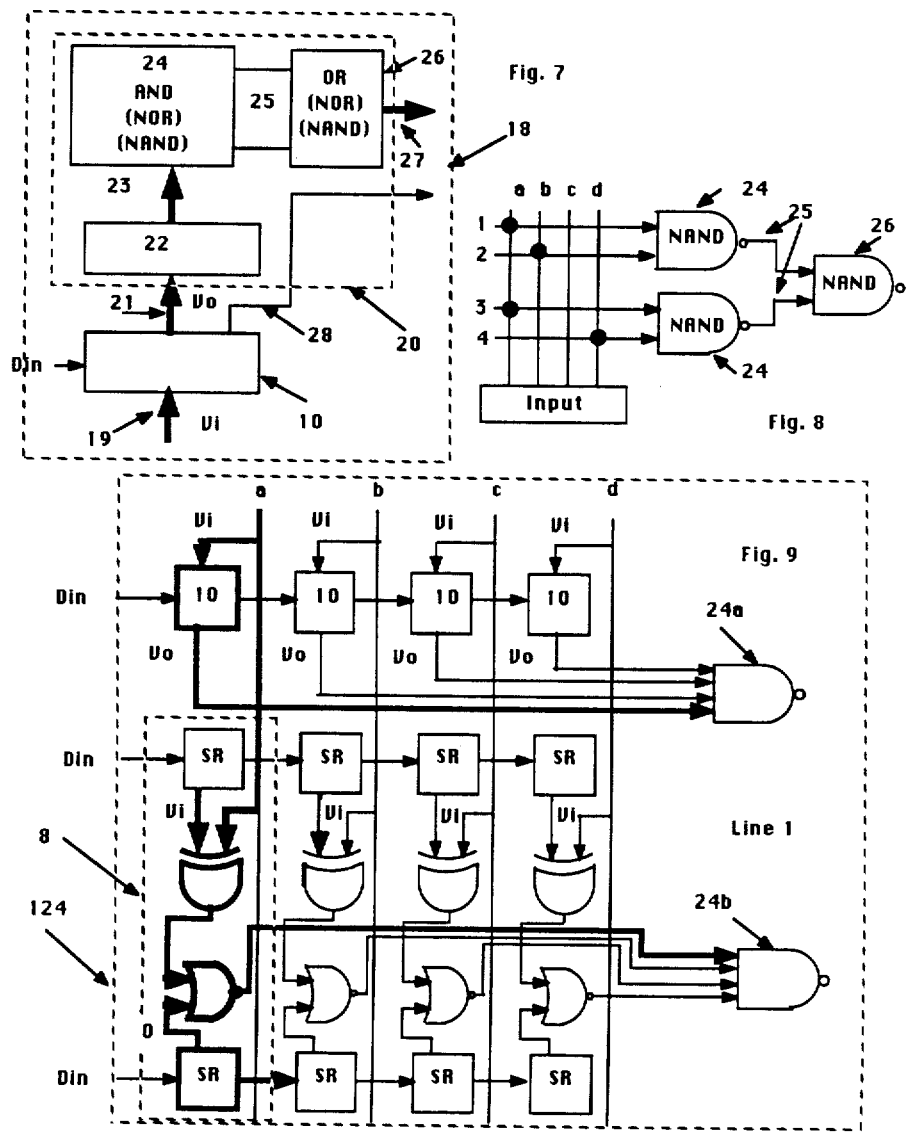

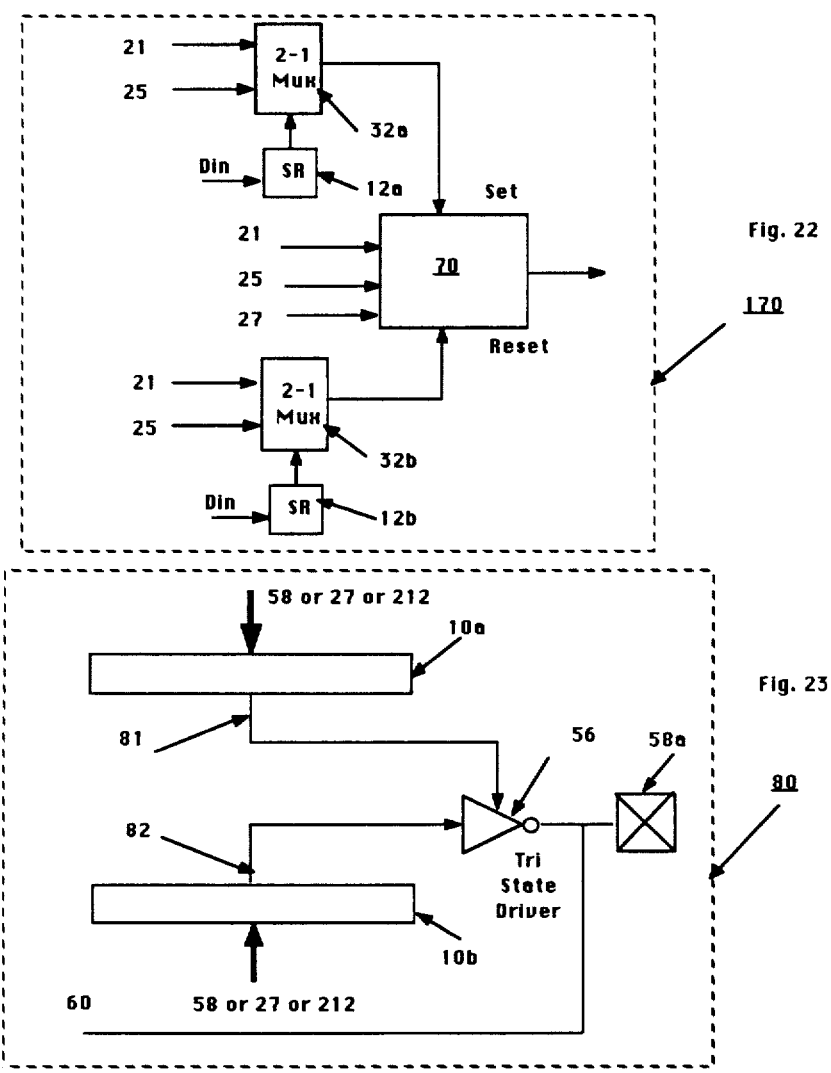

REPROGRAMMABLE CONTROL CIRCUIT

DESCRIPTION

1. Technical Background

The present invention relates to a reprogrammable control circuit and, more particularly, to a reprogrammable control circuit based upon the use of shift register cells, which can be reprogrammed and which contain control information to control an integrated circuit.

2. Background of the Invention

Shift registers are well-known in the art of integrated circuit manufacturing. Shift registers comprise a plurality of single bit cells connected serially to receive a plurality of input bit signals clocked serially into the shift registers. Shift registers have been used for a wide variety of purposes.

Transmission gates are also known in the art. They receive a control signal, an input signal and based upon the control signal, transmit or block the input signal to the output signal.

Programmable Logic Arrays or PLA's are also known in the art. PLA's typically comprise an array of AND gates whose outputs may be programmably or fixedly connected to an array of OR gates. See, for example, U.S. Pat. No. 4,124,899. See also U.S. Pat. Nos. 4,336,601; 4,348,737; 4,431,928; 4,433,331; 4,331,893; and 4,432,072.

PLA's have been programmed in one of the following ways. The integrated circuit can be programmed during the manufacturing step of the metal layer(s), often referred to as the "metal mask(s)". Typically, this is called "mask programming". In addition, PLA's have been programmed by using fusible links to control the circuit. However, the problem with fusible links or mask programming is that once the circuit has been programmed, it cannot be reprogrammed.

Random Access Memories (RAM's) have also been used to function as PLA's. See, for example, U.S. Pat. No. 4,336,601. However, the use of RAM memories to function as PLA circuits requires an address decoding network to address each RAM cell.

In the October 31, 1985 issue of "Electronic Design", published by Hayden Publishing Company, Inc., Hasbrouck Heights, N.J., page 123, a programmable logic circuit was disclosed. The XC2064 from Xilinx, Inc. of San Jose, California, purports to use RAM cells that define logic circuit functions. The data may be written and rewritten into the RAM cells, thereby reprogramming or changing the logic of the circuit. However, as previously discussed, the use of the RAM cells requires an address decoding network in order to store and/or retrieve the signals used in the programmable logic circuit.

A further problem with existing programmable logic circuits which comprise an array of AND gates whose outputs are fixed or programmably connected to an array of OR gates is that they do not efficiently utilize the logic circuit. In general, the prior art PLA requires a signal and its complement to be supplied to the AND array. However, since at any one time both the signal and its complement are never used together in any AND gate product, it is useless to have both a signal and its complement. Further, all fuse-link programmable logic circuits require expensive equipment to program them. In addition, the fuse-link programmable logic circuits must be programmed with the integrated circuit removed from the circuit in which they are to be used. This is a time-consuming and potentially damage-prone process.

Finally, existing programmable logic circuits are arranged in a rectangular array. In such a typical arrangement, the product terms (the output of the AND gate array) use less than one-third of all the product inputs (the inputs of the AND gate array). Thus, there is a great potential waste of silicon. Although this problem has been addressed and a solution, known as "folding", has been proposed by some authors (see, for example, "A Branch And Bound Algorithm for Optimal PLA Folding" by J. L. Lewandouski and C. L. Liu, $21^{st}$ Design Automation Conference, 1984, IEEE: "Pleasure: A computer Program For Simple/Multiple Constraint/Unconstraint Folding Of Programmable Logic Arrays" by G. De Micheli and Alberto Sangiovanni-Vincentelli, $20^{th}$ Design Automation Conference, 1983, IEEE; "Bounds On The Saved Area Ratio Due To PLA Folding" by Wen Tai Liu and Daniel Atkins, $20^{th}$ Design Automation Conference, 1983, IEEE); none of these solutions have proposed a specific folding geometry which would efficiently utilize the silicon.

Other integrated circuits, or components within, such as RAM's (Random Access Memory), RCIM's (Row Column Input Multiplexer), ALU's (Arithmetic Logic Unit), Counters, CAM's (Content Addressable Memory), and flip-flops are also well-known in the integrated circuit art. However, as the scale of integration of microelectronics increases and more complicated circuitry is placed on a single die (such as wafer scale integration), the problem of defects in the device or in the wafer in any particular functional circuit must be addressed. Further, a solution must be found to disable or route around these defective parts within a large integrated circuit.

SUMMARY OF THE INVENTION

In the present invention, a reprogrammable control circuit is disclosed. The reprogrammable control circuit comprises a bit shift register for serially receiving and storing a serial input bit signal and having a control signal. The control signal represents the state of the serial input bit signal stored in the bit register. A transmission gate means receives an input signal and the control signal and provides an output signal. The transmission gate means transmits the input signal to the output signal as controlled by the control signal.

BRIEF DESCRIPTION OF THE DRAWINGS

FIG. 1 is a schematic circuit diagram of a Reprogrammable Control Circuit (RCC) of the present invention.

FIG. 2a is a schematic circuit diagram of a bit shift register cell used in the RCC of the present invention.

FIGS. 2b, 2c, 2d, 2e, 2f and 2g are schematic circuit diagrams of a transmission gate, an AND gate, a NAND gate, a NOR gate, a tri-state driver and a 2 Input to 1 output Multiplexer (also known as a 2-1 Multiplexer and as a 2-1 Mux), respectively, which are examples of transmission gate means which can be used in the RCC of the present invention.

FIG. 3 is a schematic notation of a single RCC of the present invention which notation will be used throughout the drawings.

FIG. 4 is a variation of the RCC of the present invention in which the input or its complement is produced as the output, if transmission occurs.

FIG. 5a is a schematic circuit diagram of a plurality of RCC's of the present invention with a plurality of outputs.

FIG. 5b is a schematic circuit diagram of a plurality of RCC's of the present invention with a single output.

FIG. 5c is a schematic circuit diagram of a plurality of RCC's of the present invention with a plurality of output signals. Each output signal is connected to the outputs of a plurality of RCC's.

FIG. 6a is a schematic notation of a plurality of RCC's, as shown in FIG. 5a, 5b or 5c.

FIG. 6b is an alternate schematic notation of a plurality of RCC, as shown in FIG. 5c.

FIG. 7 is a schematic block circuit diagram of an improved Programmable Logic Array using an array of RCC of the present invention.

FIG. 8 is a schematic notation of the connection between an input line and the inputs to particular gates.

FIG. 9 is a schematic circuit diagram of an array of RCC's of the present invention used to programmably connect an input line to the input to a particular gate.

FIG. 22 is a schematic diagram of an output circuit for the PLA shown in FIG. 20, using the RCC's of the present invention.

FIG. 23 is a schematic diagram of an I/O circuit for the PLA shown in FIG. 20, using the RCC's of the present invention.

DETAILED DESCRIPTION OF THE DRAWINGS

Figure 10:
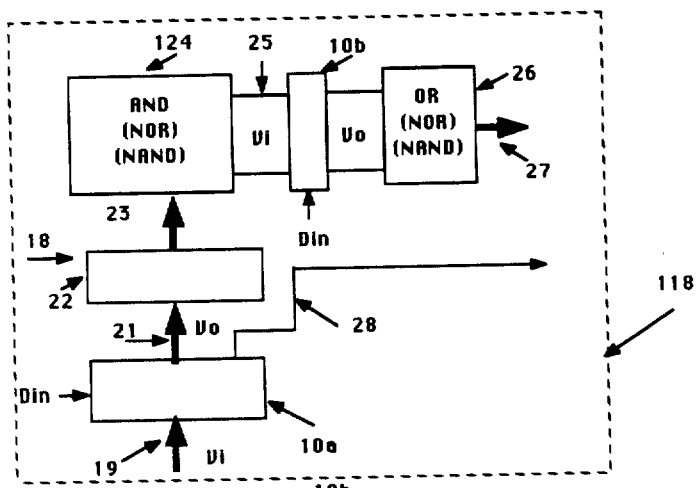
FIG. 10 is another schematic block circuit diagram of an improved Programmable Logic Array in which NOR-NOR or NAND-NAND logic arrays are used along with the RCC's of the present invention.

Referring to FIG. 1, there is shown a Reprogrammable Control Circuit (RCC) 10 of the present invention. The RCC 10 comprises of a bit shift register 12 and a transmission gate means 14. The bit shift register 12 receives and stores a serial input bit signal $D_{in}$ and produces a serial output signal $D_{out}$, and a control signal $\phi$. The transmission gate means transmits the signal $V_i$ to $V_o$ depending upon the control signal $\phi$.

FIG. 2a is a detailed schematic circuit diagram of the bit shift register 12. Typically, the bit shift register 12 has an input line for data in ($D_{in}$) and input lines for "strobe in" and "strobe out". As previously discussed, the shift register 12 has a control output signal $\phi$. In a serially connected multi-bit shift register, the outputs of the bit shift register 12 would also comprise a "strobe in", a "strobe out" and a "$D_{out}$", all supplied to another bit shift register.

FIG. 2b is a schematic diagram of a transmission gate TG which can be used in the transmission gate means 14 of the RCC 10. The transmission gate TG receives the control signal $\phi$ and, depending on the integrated circuit processing technology used, its complement $\phi^*$ or another signal. The transmission gate TG also receives $V_i$ and produces $V_o$ as previously described.

Alternatively, the transmission gate means 14 can comprise simply an AND gate which receives $\phi$ and $V_i$ as its input and produces $V_o$, as its output as shown in FIG. 2c. $V_o$ will be "1" when both $\phi$ and $V_i$ are "1" and $V_o$ will be "0" otherwise.

Also alternatively, the transmission gate means 14 can comprise simply an NAND gate which receives $\phi$ and $V_i$ as its input and produces $V_o$, as its output as shown in FIG. 2d. $V_o$ will be "1" when either $\phi$ and $V_i$ are "0" and $V_o$ will be "0" when both $\phi$ and $V_i$ are "1".

Also alternatively, the transmission gate means 14 can comprise simply an NOR gate which receives $\phi$ and $V_i$ as its input and produces $V_o$, as its output as shown in FIG. 2e. $V_0$ will be "0" when either $\phi$ and $V_i$ are "1" and $V_o$ will be "1" when both $\phi$ and $V_i$ are "0".

Also alternatively, the transmission gate means 14 can comprise simply a tri-state driver gate which receives $V_i$ as its data input, $\phi$ as its control input and produces $V_o$, as its output as shown in FIG. 2f. The signal $V_o$ will be forced onto the output line when $\phi$ is "1". The state of $V_0$, in this case, will be "1" if $V_i$ is "1", otherwise it will be "0". If $\phi$ is "0", then the signal $V_o$ will not be forced onto the output line, and $V_i$ will not affect the output signal $V_o$.

Finally, the transmission gate means 14 can comprise simply a 2 Input to 1 Output Multiplexer gate which receives $V_{i0}$ and $V_{i1}$ as its data input, $\phi$ as its control input and produces $V_o$, as its output as shown in FIG. 2g. The signal $V_o$ will equal $B_{i0}$ if $\phi$ is "0" and $V_o$ will equal $V_{i1}$ if $\phi$ is "1".

FIG. 3 is a symbolic notation of the RCC 10 of the present invention showing the data $D_{in}$ supplied to the bit shift register 12 of the RCC 10 and $V_i$ supplied to the transmission gate means 14 and $V_o$ outputted from the transmission gate means 14.

It should be recognized that if a transmission gate TG were used as the transmission gate means 14, the signals $V_i$ and $v_o$ may be reversed and the transmission gate TG simply connects two data signal paths, $V_i$ and $V_o$, depending upon $\phi$.

FIG. 4 shows a circuit 8 using the RCC 10 of the present invention. The circuit 8 comprises a bit shift register 12, an RCC 10 and an exclusive OR gate 30. The signal $V_{i0}$ is supplied to the exclusive OR (HOR) gate 30. The other input to the HOR gate is the $\phi$ of the shift register 12. If $\phi$ is "0", then $V_i$ is the output, otherwise $V_i^*$ is the output. This is supplied to the RCC 10. Thus, with the circuit 8, if the RCC 10 permits the transmission of data, the output can be $V_i$ or $V_i^*$ depending upon the content of the shift register 12 within the RCC 10. The RCC 10 then controls whether $V_i$ or $V_i^*$ are to be output from it.

Referring to FIG. 5a, there is shown a plurality or an array RCC's 10. All of the shift registers 12 within the array of RCC's 10 are connected serially and receive data serially as the input bit signal is clocked in from one shift register 12 to another. Each of the bit shift register 12 produces a control signal $\phi$ which is supplied to a transmission gate means 14 with each RCC 10 within the array. Each of the transmission gate means 14 also receives an input signal. In FIG. 5a, three input signals are shown and denoted as "$V_{i1}$", "$V_{i2}$" and "$V_{i3}$". The output of each of the transmission gate means 14 comprises the signals "$V_{o1}$", "$V_{o2}$", "$V_{o3}$", respectively.

For additional versatility, some or all of the $V_o$ signals "$V_{o1}$","$V_{o2}$", and "$V_{o3}$" may be connected together.

Thus a single output $V_o$ may be selected to be connected to one of the many $V_i$ signals. This is shown in FIG. 5b wherein $V_{i-1}$, $V_{i-2}$, and $V_{i-3}$ are the input signals and $V_o$ is the output signal.

Referring to FIG. 5c, there is shown an array of RCC's 10 arranged in rows, each RCC 10 of a row sharing its output as in FIG. 5b.

Symbolically, the array of RCC's 10, shown in FIG. 5a or 5b or 5c is represented, as shown in FIG. 6a. Alternatively, the array of RCC's 10 shown in FIG. 5c is also symbolically represented, as shown in FIG. 6b.

Referring to FIG. 7, there is shown an improved PLA 18 using an array of RCC 10 of the present invention with a PLA 20 of the prior art. A typical PLA of the prior art is shown and is disclosed in U.S. Pat. No. 4,124,899, which is incorporated herein by reference. The PLA 20 of the prior art comprises an input 22 which supplies the input signals 23 to an array of AND logic gates 24. The output 25 of the array of AND logic gates 24 is supplied as input to an array of OR gates 26. The output 27 of the array of OR gates 26 are the output of the PLA 20. In one version of the prior art as shown and described in U.S. Pat. No. 4,124,899, a plurality of groups of AND logic gates are shown. The output of the AND gates are fixedly connected to a group of OR gates 26 at the input thereof. In the improved PLA 18 shown in FIG. 7, the array of RCC 10 is connected to the input drivers 22. The transmission of the input signals $V_i$, 19, to the output signals $V_o$, is determined by the date stored in the shift registers 12 of the array of RCC 10. The $V_o$ signals 21 are the input to the PLA 20. In addition, the output $V_o$ signal(s) 28 may be supplied for use with the output 27 of the PLA 20, as will be described later. Thus, by storing selective bit patterns in the shift registers 12 of the RCC 10, the $V_o$ signals 21 would activate the AND gates in the array 24 and subsequently the OR gates in the array 26 and would determine the logic output of the PLA 20. Since a single $V_o$ signal may be connected to one of many $V_i$ signals, a greater selection of input signals to the improved PLA 18 is achieved.

In another variation of the PLA 20 of the prior art, the array 24 of AND gates and array 26 of OR gates are replaced by an array 24 of NAND gates and an array 26 of NAND gates, respectively. Logically, the replacement of NAND-NAND gates for AND-OR gates results in a functionally identical circuit.

A further variation of the PLA 20 of the prior art replaces array 24 of AND gates and array 26 of OR gates are replaced by an array 24 of NOR gates and an array 26 of NOR gates, respectively. Logically, the replacement of NOR-NOR gates for AND-OR gates is complementary, meaning that if the outputs of the replacement circuit are complemented, the two circuits are logically would be equivalent.

Referring to FIG. 8, there is shown a portion of the AND(NAND) array 24 with a single OR(NAND) gate 26. The connection between the input lines "a", "b", "c" and "d" to the input of the particular AND(NAND) gate 24 "1", "2", "3" or "4" is shown schematically by ●. Thus, in FIG. 8, input "a" may be connected to "1" and "3". As previously stated, in the prior art, this connection is achieved by using fusible links, blowing the unconnected connections. Once the link is blown, "a" cannot be reconnected to "2" or "4".

Referring to FIG. 9, there is shown a portion of an improved AND (NAND) array 124 in which the input lines "a", "b", "c" or "d" can be reprogrammably connected to the gate input line "1" or "2" using RCC 10 or 8 of the present invention. This is achieved by using arrays of RCC's 10 of the present invention. Each input line is connected to an RCC 10 as the input $V_i$ thereof. The output $V_o$ is supplied to a NAND gate 24a. In addition, by using the circuit 8, the input line or its complement may be used as the gate input to the gate 24b. Note that in the following figures, RCC 10's used in creating the AND-OR planes of PLA's can refer to either RCC 10 of FIG. 1 or RCC 8 of FIG. 4.

Referring to FIG. 10, there is shown another improved PLA 118 using arrays of RCC 10 and/or RCC 8 of the present invention. The improved PLA 118 comprises a first array of RCC 10a to receive a plurality of input $V_i$ 19 signals and to provide a plurality of output signals $V_o$ 21 therefrom. Similar to the improved PLA 18, other $V_o$ signals 28 may be supplied for use with the output 27. The plurality of $V_o$ signals 21 are supplied to an input drivers 22, which are supplied to an array 124 of AND (or NAND or NOR) gates. The array 124 of gates embody the improvement, shown and described in FIG. 9. The output of the array 124 of gates, however, is a plurality of $V_i$ signals 25 which are again supplied to a second array of RCC 10b of the present invention. From the second array of RCC 10b, the plurality of $V_o$ signals is supplied to a second array 26 of OR (or NAND or NOR) gates. The output 27 of the second array 26 of gates is the output of the improved PLA 118. With the improved PLA 118, the input lines 23 can be programmably connected to the inputs of the AND (or NAND or NOR) gates of the first array 124. Further, the output of the AND (or NAND or NOR) gates from the first array 124 can then be programmably connected to the input of the second array 26 of OR (or NAND or NOR) gates. The programmable connection of the output of the first array 124 of the AND (or NAND or NOR) gates to the input of the second array 26 of the OR (or NAND or NOR) gates can be seen by referring to FIG. 11 and FIG. 12.

Figure 11:
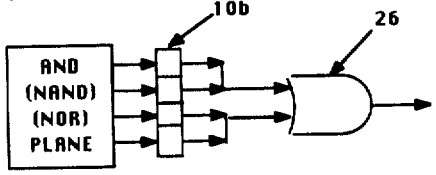
FIG. 11 is a schematic circuit diagram of a programmable NOR gate using the RCC's of the present invention.

In FIG. 11, the output 25 of each AND plane gate from the first array 124 is supplied to an RCC 10b. A group of $V_o$ signals from the RCC's 10b is supplied to an OR gate in the second array 26. In the embodiment shown in FIG. 11, the OR gate in the second array array 26 has two inputs. Thus, two of the outputs 25 of the AND gates from the first array 124 are supplied as inputs to an OR gate in the second array 26. Further, by using the RCC 10b, a greater number of $V_o$ signals can be connected to a plurality of input signals the OR plane. Thus, product term sharing is also achieved.

Figure 12:
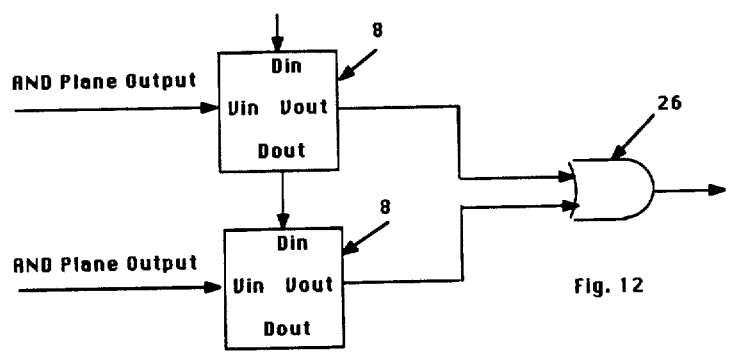
FIG. 12 is another schematic diagram of a programmable NOR gate, using the RCC's of the present invention wherein a signal or its complement is supplied to the NOR gate.

Referring to FIG. 12, each of the output 25 from an AND gate from the first array 124 is supplied to a circuit 8. The advantage of the embodiment shown in FIG. 12 is that the output of the AND plane, or its complement could be enabled to be an input to the OR plane 26.

As previously described, the arrays of NAND-NAND and NOR-NOR (with an assumed final inversion) are logically equivalent to the arrays of AND-OR gates. Thus, for each of the circuits described in FIGS. 11 and 12, the circuit would function just as well where the AND's and OR's were replaced by NAND's, or replaced by NOR's (with the final output inverted).

Figure 13:
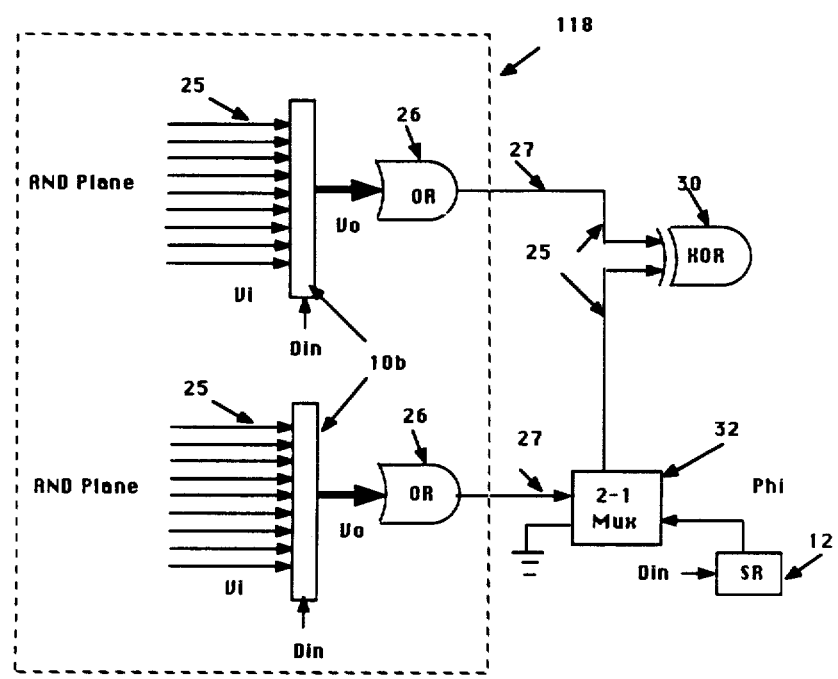
FIG. 13 is a schematic circuit diagram of two programmable OR gates using the RCC's a of the present invention and wherein the outputs thereof are supplied to an exclusive OR gate.

Referring to FIG. 13, there is shown a circuit building upon the output 27 of the improved PLA 118. As previously described, the improved PLA 118 comprises the output 25 from the first array 124 of the AND gates being supplied to a second array of RCC 10b of the present invention, whose output is then supplied to the OR gates in the second array 26. In. FIG. 13, two groups of outputs 25 are shown. One of the outputs 27 of the OR gate 26 is supplied as an input to an exclusive OR gate 30. The output 27 of the other OR gates 26 is supplied as an input to a 2-1 multiplexer 32, which can also be an AND gate. The other input of the multiplexer 32 is connected to ground. The control from the multiplexer 32 is supplied by the control signal $\phi$ from a single bit shift register 12. The output of the multiplexer 32 is supplied as the other input to the exclusive OR gate 30. In this circuit, the output of the improved PLA 118 can be further processed by additional logic circuitry.

Figure 14:
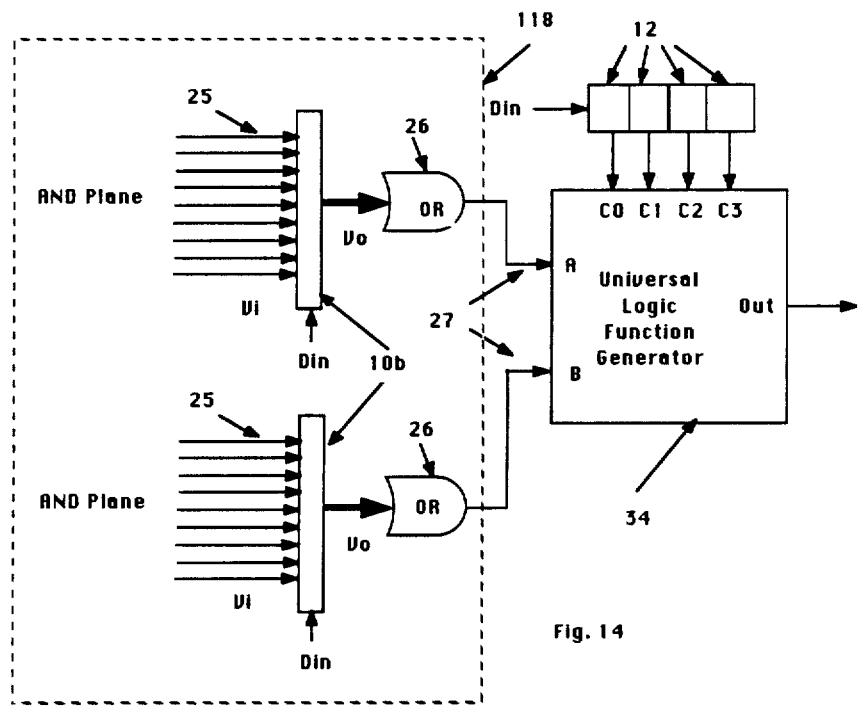
FIG. 14 is another schematic circuit diagram of two programmable OR gates using the RCC's of the present invention, wherein the outputs of the OR gates are supplied to a universal logic function generator.

Referring to FIG. 14, there is shown another circuit to further process the output 27 of an improved PLA 118. Similar to the circuit described and shown in FIG. 10, the improved PLA 118, shown in FIG. 14, has two output signals 27 from two OR gates 26. These outputs are supplied directly to a universal logic function generator 34. Such a device is shown and is described in "Introduction to ULSI Systems" by Carver Mead and Lynn Conway (pages 150–153), which is incorporated herein by reference. The universal logic function generator 34 also has 4 inputs thereto which are supplied by the control signals $\phi 0$, $\phi 1$, $\phi 2$ and $\phi 3$ of four bit shift registers 12. Thus, the state of the data stored in the shift registers 12 determine the logic function to be generated by the universal logic function generator 34. That logic function operates on the output of the improved PLA 118.

Figures 15, 16:
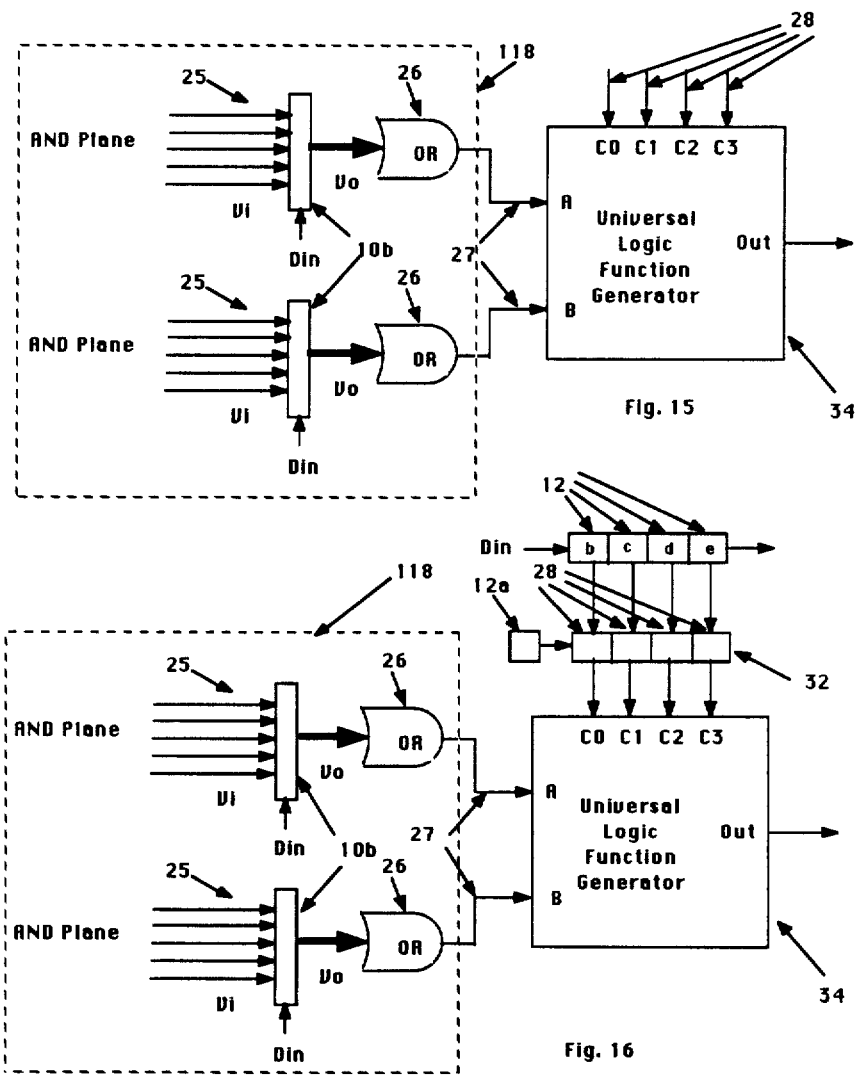
FIG. 15 is yet another schematic circuit diagram of two programmable OR gates using the RCC's of the present invention, wherein the outputs of the OR gates are supplied to a universal logic function generator which is controlled by the output of the RCC's supplying the input to the PLA.
FIG. 16 is still yet another schematic circuit diagram of two programmable OR gates using the RCC's of the present invention, wherein the outputs of the OR gates are supplied to a universal logic function generator which is controlled by either the contents of a shift registers or by the output of the RCC's supplying the input to the PLA.

Referring to FIG. 15, there is shown yet another variation of a circuit to further process the output 27 of an improved PLA 118. In the embodiment shown in FIG. 15, the only difference between the circuit shown in FIG. 15 and that shown and described in FIG. 14 is that the four inputs to the universal logic function generator 34 are also selected inputs 28 from the output of the first array of RCC 10a. Thus, the universal logic function generator 34 can process signals from the output of the first array 10a of RCC as opposed to the circuit shown in FIG. 14, wherein the universal logic function generator 34 processes only stored, albeit changeable, data in shift registers 12.

Referring to FIG. 16, there is shown still yet another circuit to further process the improved PLA 118. In this circuit, the functions of the circuit shown and described in FIGS. 14 and 15 are combined. The input to the universal logic function generator is from a plurality of multiplexers 32 whose inputs are from the inputs 28, and from the $\phi$ signals of the shift registers 12(b, c, d, and e). The control signal for the 2-1 Multiplexers 32 is from another shift register 12a.

Figure 17:
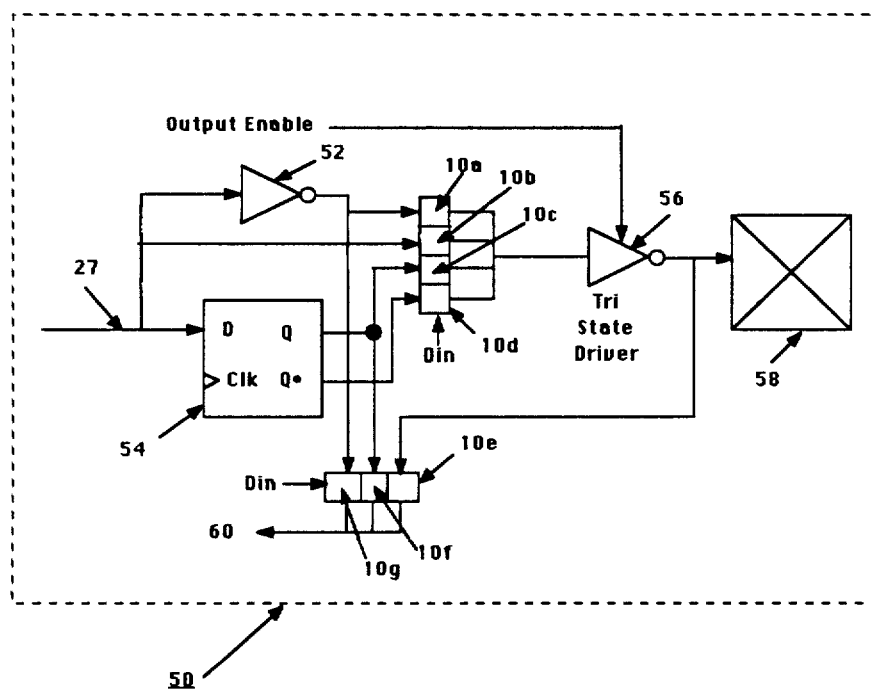
FIG. 17 is a schematic diagram of an I/O circuit, useful in a PLA, using RCC's of the present invention.

Referring to FIG. 17, there is shown an I/O circuit 50 to be used with the improved PLA 18 or 118 and using RCC's 10. The output 27 of the improved PLA 18 or 118 is supplied to a number of locations. First, the signal 27 is supplied to an inverter 52 and is then the $V_i$ signal to an RCC 10a. The signal 27 is also supplied directly as $V_i$ to an RCC 10b. The signal 27 is also supplied to a D flip-flop 54. The Q output of the D flip-flop 54 is then supplied to a third RCC 10c. Finally, the Q* output of the D flip-flop 54 is then supplied as $V_i$ to a fourth RCC 10d. The $V_o$ of each of the RCC 10a–10d are then supplied to a tri-state driver cell 56. The tri-state driver cell 56 receives an additional output-enable signal to enable that driver. The output of the tri-state driver 56 is directed to a pad 58. The output of the pad 58 is also supplied as $V_i$ to a fifth RCC 10e. The Q output of the D flip-flop 54 is also supplied to a sixth RCC 10f. Finally, the signal 27 is supplied to a seventh RCC 10g. The $V_o$ of the fifth, sixth and seventh RCC 10e–10g, respectively, are all supplied to a logic feedback signal path 60.

In the I/O circuit 50, shown in FIG. 17, the output supplied to the pad 58 may be the asynchronous, inverted output 27 of PLA 18 or 118, asynchronous, non-inverted output 27, synchronous, non-inverted output 27 (Q of the D flip-flop 54) or synchronous, inverted output 27 (Q* of the D flip-flop 54). The signal that is present on the logic feedback signal path 60 may be the input signal from the pad 58, the output signal from the tri-state driver cell 56, the output Q of the D flip-flop 54, or the asynchronous, non-inverted output 27. The last three possible signals are all feedback signals. The inverted asynchronous output 27 of the PLA is the output of the inverter 52. The synchronous signals (inverted and non-inverted) are the output of the flip-flop 54. The RCC 10a–10d control the input signal supplied to the tri-state driver 56. The RCC 10e–10g control which signal is supplied to the signal line 60.

Figure 18:
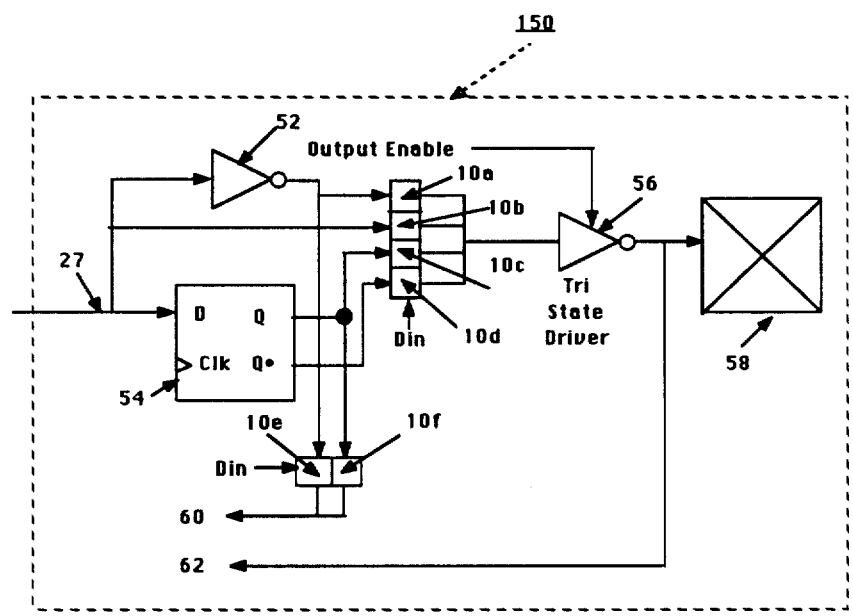
FIG. 18 is another schematic diagram of an I/O circuit useful in a PLA, using the RCC's of the present invention.

Referring to FIG. 18, there is shown another I/O circuit 150 using RCC's 10 of the present invention and to be used with the output 27 of the improved PLA 18 or 118. The I/O circuit 150 is substantially the same as the I/O circuit 50, shown in FIG. 17, with the exception that there are two input/feedback paths 60 and 62. The output of the I/O circuit 150 at the pad 58 are the same four possible combinations of output signals as shown and described for the I/O circuit 50 in FIG. 50. The first signal input/feedback path 60, however, receives $V_o$ from an RCC 10f and 10e, which receives as the $V_i$ signal therefor the asynchronous, non-inverted and synchronous, non-inverted output 27, respectively. A second signal input/feedback path 62 receives the input signal from the pad 58 or the output signal of the tri-state driver cell 56.

Figure 19:
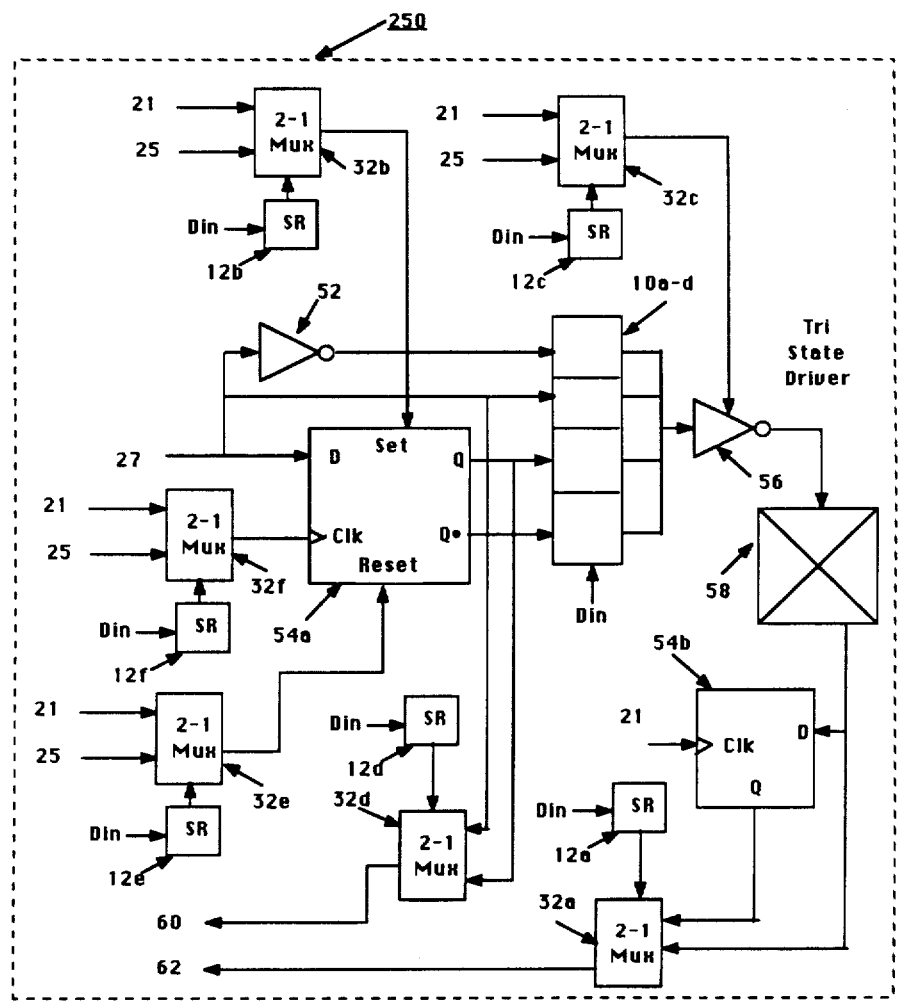
FIG. 19 is yet another schematic diagram of an I/O circuit useful in a PLA, using the RCC's of the present invention.

Referring to FIG. 19, there is shown another improved I/O control circuit 250, using RCC's 10 of the present invention and to be used with the output 27 of the improved PLA 18 or 118. This circuit 250 comprises four RCC's 10 of the present invention, labelled as 10a–10d, respectively. The circuit 250 also comprises 2 D-style flip-flops 54a and 54b, a tri-state driver 56, an inverter 52, and six 2-1 multiplexers labelled 32a–32f, respectively. Each of the 2-1 multiplexers has an associated single bit shift register cell 12(a–f), which can contain data and which determines the selection path of the associated multiplexer 32. Since there are two D-style flip-flops 54a and 54b, the pin input and output latching of the circuit 250 are cleaved from one another so that both can serve as inputs to the improved PLA 18 or 118 independently and also provide asynchronous latching of data to be used from the circuitry external to the pad 58, as well as internally, within the pad 58 (such as from the output 27 of an OR plane 26).

Figure 20:
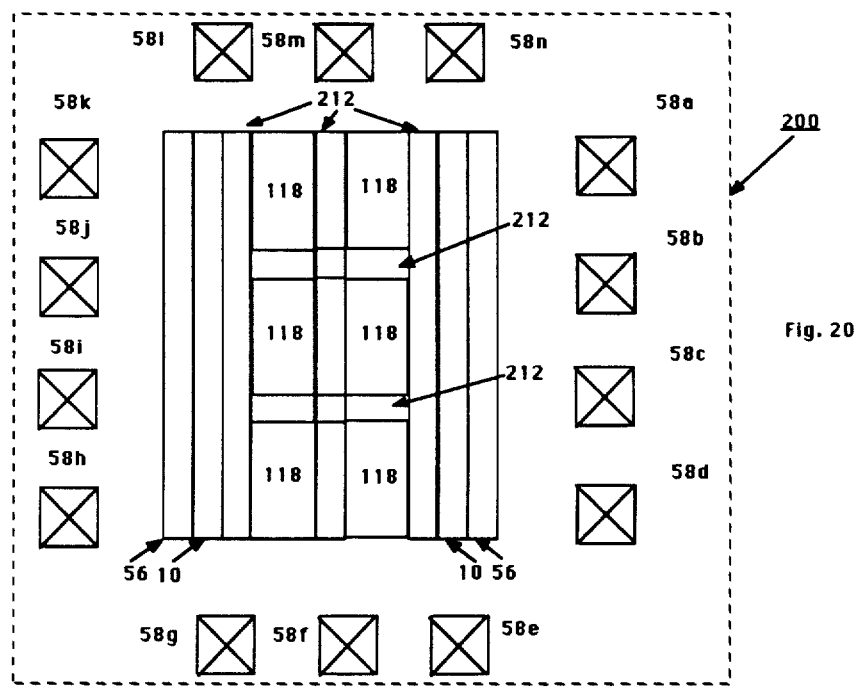
FIG. 20 is a block diagram of an integrated circuit having a multiple number of PLA's arranged in a multi-row, multi-column configuration.

Referring to FIG. 20, there is shown an integrated circuit 200. The integrated circuit 200 comprises a plurality of pads 58(a–n) which surround the die 200. The die 200 comprises a plurality of improved PLA's 18 or 118 arranged in a plural row, plural column layout. A plurality of busses 212 separate one PLA 18 or 118 from another. Contiguous to the plurality of PLA's 18 or 118 are a plurality of arrays of RCC 10. Adjacent thereto are the plurality of tri-state drivers 56.

Since the number of pads 58 is limited, not every output 27 of each PLA 18 or 118 is supplied to a pad 58. Further, it is not necessary. What is necessary is for certain outputs 27 of a PLA 18 or 118 to be supplied as input to another PLA 18 or 118 within the circuit 200. This is accomplished by the use of the internal buses 212.

Figure 21:
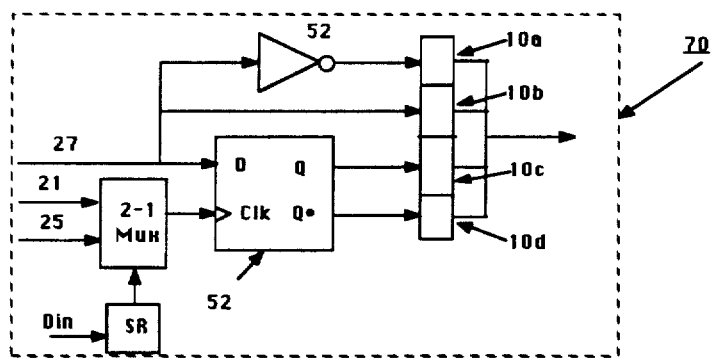
FIG. 21 is a schematic diagram of an output circuit for the PLA shown in FIG. 20, using the RCC's of the present invention.

Referring to FIG. 21, there is shown an I/O circuit 70 which is useful in the circuit 200, using RCC's 10 of the present invention. The I/O circuit 70 is a portion of the I/O circuit 250, shown in FIG. 19. The circuit 70 comprises four RCC's 10a–10d, an inverter 52, a D-style flip-flop 54, a 2-1 multiplexer 32 and a single bit shift register 12. The multiplexer 32 receives as its input therefore the input $V_o$ 21 or the output 25 of the AND array 24 or 124 from the same or different PLA 118. The shift register 12 generates the control state of the multiplexer 32. The output of the multiplexer 32 is supplied to the clock input signal of the flip-flop 54. The output 27 is supplied to the D input of the flip-flop 54. The output 27 is also supplied to the RCC 10b and the inverted output is supplied to the RCC 10a. The Q and Q* outputs of the flip-flop 54 are supplied to the RCC 10c and 10d, respectively.

Referring to FIG. 22, there is shown another I/O circuit 170. The circuit 170 comprises two multiplexers 32(a–b), respectively in addition to the circuit 70. Each of the 2-1 multiplexers 32(a–b) has an associated shift register 12(a–b), whose data stored therein determines the control state of the multiplexer 32(a–b), respectively. Each of the multiplexers 32(a–b) has two inputs. The inputs can be from the same PLA 18 or 118 or different PLA 18 or 118. The output of one multiplexer 32a is supplied to the set input of the flip-flop 54 in circuit 70. The output of the other multiplexer 32b is supplied to the reset input of the flip-flop 54 in circuit 70.

Referring to FIG. 23, there is shown a pin I/O circuit 80. The pin I/O circuit 80 comprises a tri-state driver cell 56. The tri-state driver cell 56 has an output enable 81 and an output data signal 82 as its inputs. These are supplied from the arrays of RCC 10a and 10b, respectively. The $V_i$ of the RCC 10a are supplied from pads 58 or outputs 27 of PLA's 18 or 118, or from internal busses 212. The $V_i$ of the RCC 10b are supplied from pads 58 or outputs 27 of PLA's 18 or 118, or from internal busses 212.

The output of the tri-state driver cell 56 is supplied to a pad 58a and is also supplied to as an input return signal 60. In the operation of the pin I/O circuit 80, if a signal is impressed on the internal buss 212, and if the RCC 10a transmits that signal through to enable the output of the driver cell 56, then the bus signal selected by RCC 10b is passed through as the input signal to the driver cell 56. However, if the output enable signal of the tri-state driver cell 56 is not enabled and irrespective of the data output $V_o$ from the RCC 10b array, no data will be transmitted from the driver cell 56. Thus, the signal state on the pad 58a will used as the input signal on the internal bus path 60.

Figure 24:
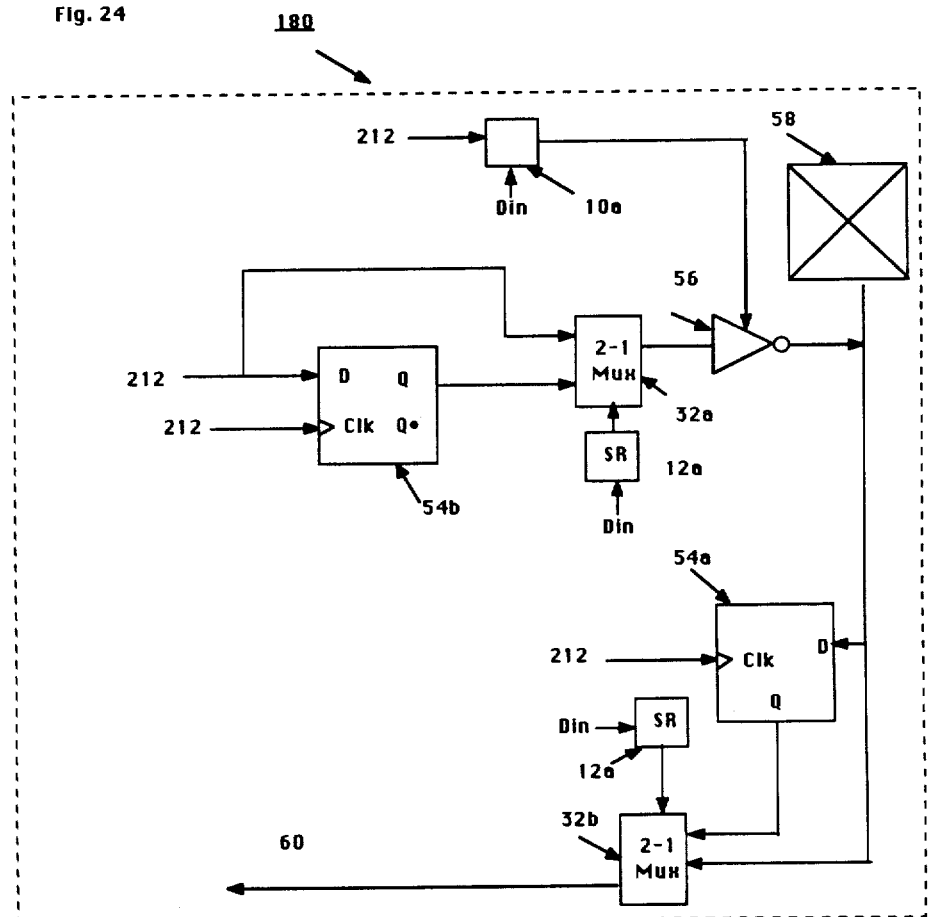
FIG. 24 is a schematic diagram of another I/O circuit for the PLA shown in FIG. 20, using the RCC's of the present invention.

Referring to FIG. 24, there is shown another pin I/O circuit 180. Similar to the pin I/O circuit 80 as shown and described in FIG. 23, the pin I/O circuit 180 comprises an RCC 10a which is connected to an internal bus 212. The $V_o$ of the RCC 10a is supplied to the output enable of the tri-state driver cell 56. The other input to the tri-state driver 56 is from a 2-1 multiplexer 32a. The output of the tri-state driver cell 56 is supplied to a pad 58 and is also supplied to a flip-flop 54a and a second multiplexer 32b. Single bit shift registers 12a and 12b controls the state of the multiplexers 32a and 32b, respectively. The two inputs of the first multiplexer 32a are from the bus signal 212 and the D style flip-flop 54b. D style flip-flop 54b has a clock which is supplied by a bus signal 212. A bus signal 212 is supplied to the clock input of the second D style flop-flop 54a. The Q or non-inverted output of the second D style flip-flop 54a is also supplied to a second multiplexer 32b. The output of the second multiplexer 32b provides the input signal or the feedback signal along the signal path 60.

The major purpose of this circuit 180 is to enable the output 27 from the PLA's 18 or 118 or the bus signal 212 to be used in situations which require the latching of the signals, even if it is not time to utilize them or to transmit them. The output signal is stored in the D style flip-flop 54b or, if in the feedback case, is stored in the D style flip-flop 54a. If used as an input, the input signal is stored in the D flip-flop 54a. When it is time to place the output signal on the pad 58, a signal is placed on a bus signal 212 and is passed through RCC 10a to enable the tri-state driver cell 56 to pass the data through as the output.

Figure 25:
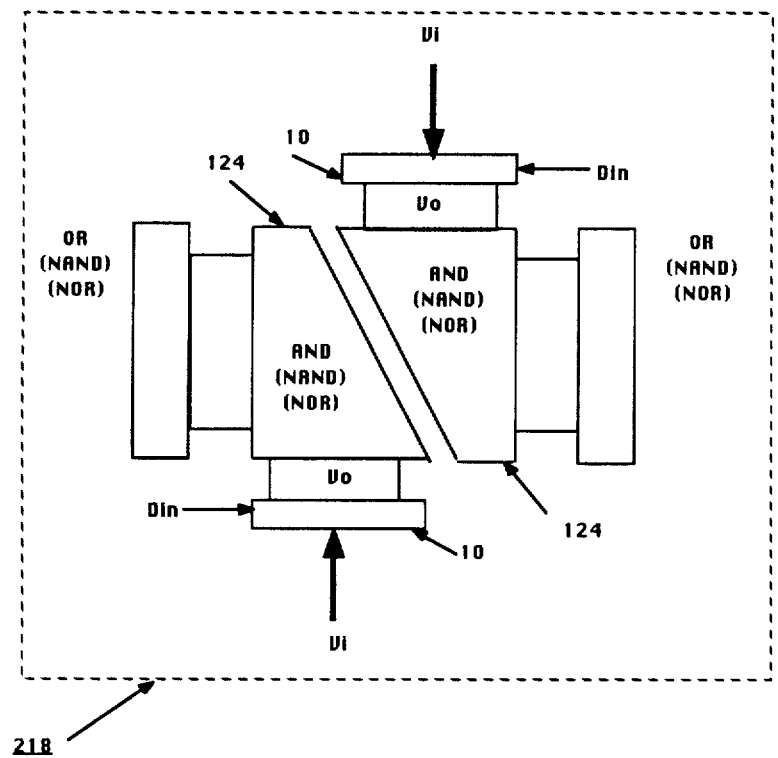
FIG. 25 shows an improved PLA using the RCC's of the present invention and having triangular folding.

Referring to FIG. 25, there is shown another improved PLA 218 of the present invention, using the RCC 10 of the present invention. The improved PLA 218 comprises an array of RCC 10 which has, as inputs thereto, a plurality of signals $V_i$ and has, as outputs therefrom, a plurality of signals $V_o$. The plurality of signals $V_o$ are supplied to the first array of AND gates 124 whose outputs are supplied to a second array 26 of OR gates. As described previously, the arrays 124 and 26 of AND-OR gates can be replaced by arrays 24 and 26 of NAND-NAND or NOR-NOR-INVERT gates. The only difference between the improved PLA 218 from the improved PLA 118 is that the first array 124 of AND gates in the improved PLA 218 is substantially triangularly shaped. Further, as will be appreciated, the improved PLA 218 can also comprise a second array of RCC 10's interposed between the output of the first array 124 of AND gates and the input of the second array 26 of OR gates, as shown and described for the improved PLA 118.

Figure 26:
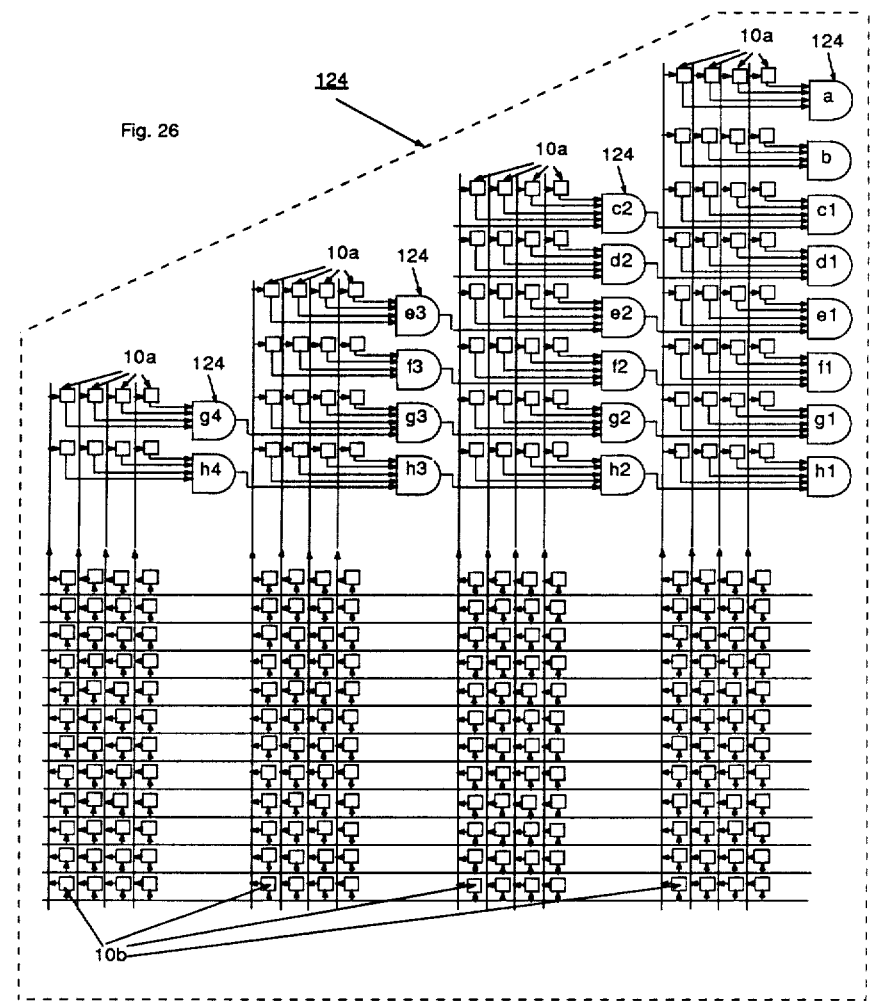
FIG. 26 is a schematic circuit diagram of one form of implementation of the triangular folding shown in FIG. 25.

By a triangularly-shaped array of AND gates, it is meant that the array 124 is arranged such that the number of programmable inputs to each sub-array of AND gates 124 decreases. By sub-array, this is meant a collection of one or more AND gates having the same number of programmable inputs. This is shown graphically in FIG. 26, wherein each sub-array has two AND gates possessing the same number of programmable inputs. There are four sub-arrays 124(a and b), 124(c and d), 124(e and f) and 124(g and h) having 4, 8, 12 and 16 programmable inputs, respectively. The use and polarity of each programmable input to the gates 124(a–h) is controlled by an RCC 10a of the current invention. See FIGS. 4 and 9 and their corresponding documentation for a detailed discussion of this instance of the current invention.

The inputs to the AND gates are in turn selected from buss signals 212, outputs of improved PLA's 18 or 118 or from pins 58 by use of an array of RCC 10b of the current invention. See FIGS. 1 and 2b and their corresponding documentation for a detailed discussion of this instance of the current invention.

It should be appreciated that there are many advantages to using a triangularly-folded geometry for the array 124. First, since the number of inputs to each logical AND sub-array that is to be used can vary, the selection of the particular AND gate having the requisite number of inputs can be optimized. Thus, the most commonly used inputs of the improved PLA 218 can be routed to the AND gate, having the smallest number of inputs. Further, since the performance of a logical gate is dependent upon the number of inputs thereto, the gates having fewer inputs may be reserved for those logic applications where speed is of the essence. It is estimated that, by utilizing a triangularly shaped array of AND gates, improved efficiency of silicon utilization and use of the gates is achieved.

Figure 27:
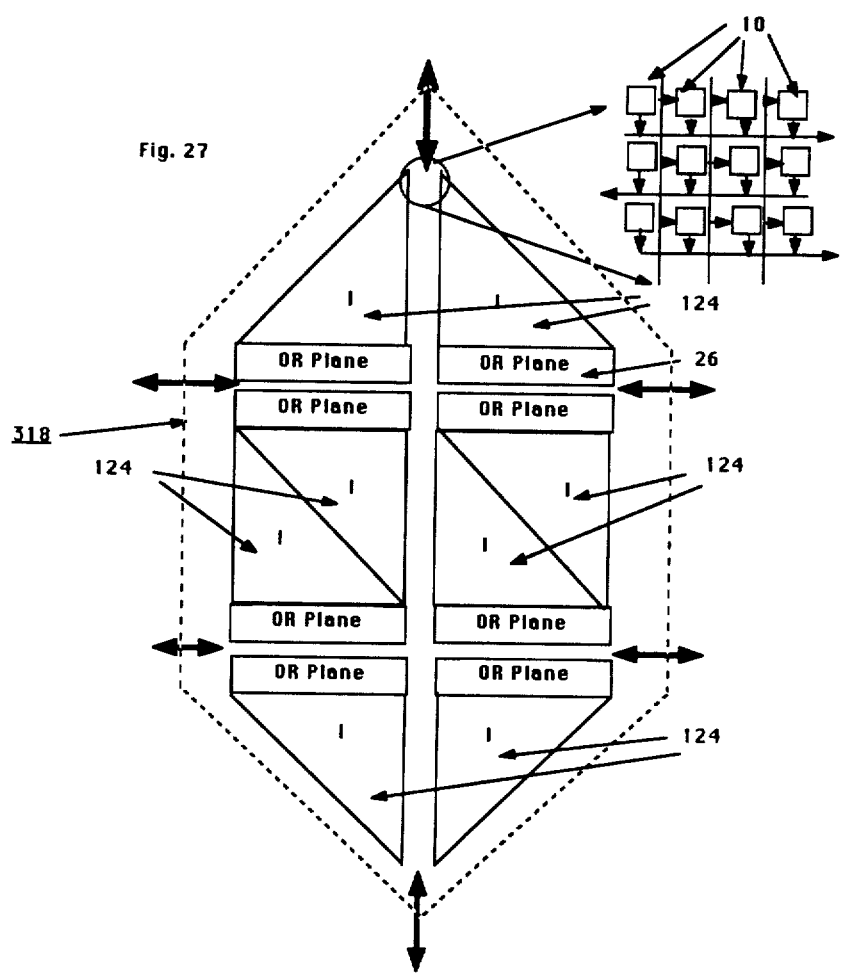
FIG. 27 is another geometry of a folded PLA using the RCC's of the present invention.
Figure 27A:
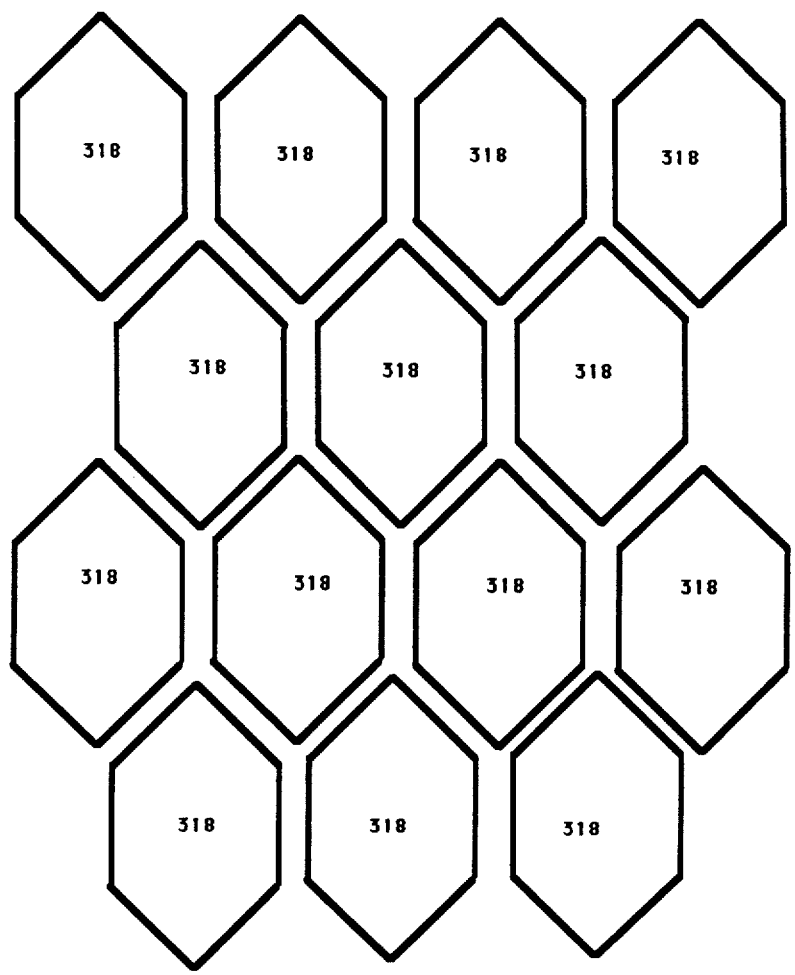

Referring to FIG. 27, there is shown another geometry for an improved PLA 318. The improved PLA 318 has the shape of a hexagon. The advantages of the improved PLA 318 include the advantages discussed for the improved PLA 218. The PLA 318 has as additional advantage in that by being hexagonal in shape, these arrays can be packed very efficiently for use in extremely large integrated circuits and wafer scale integrated circuits as shown in FIG. 27a.

Figure 28:
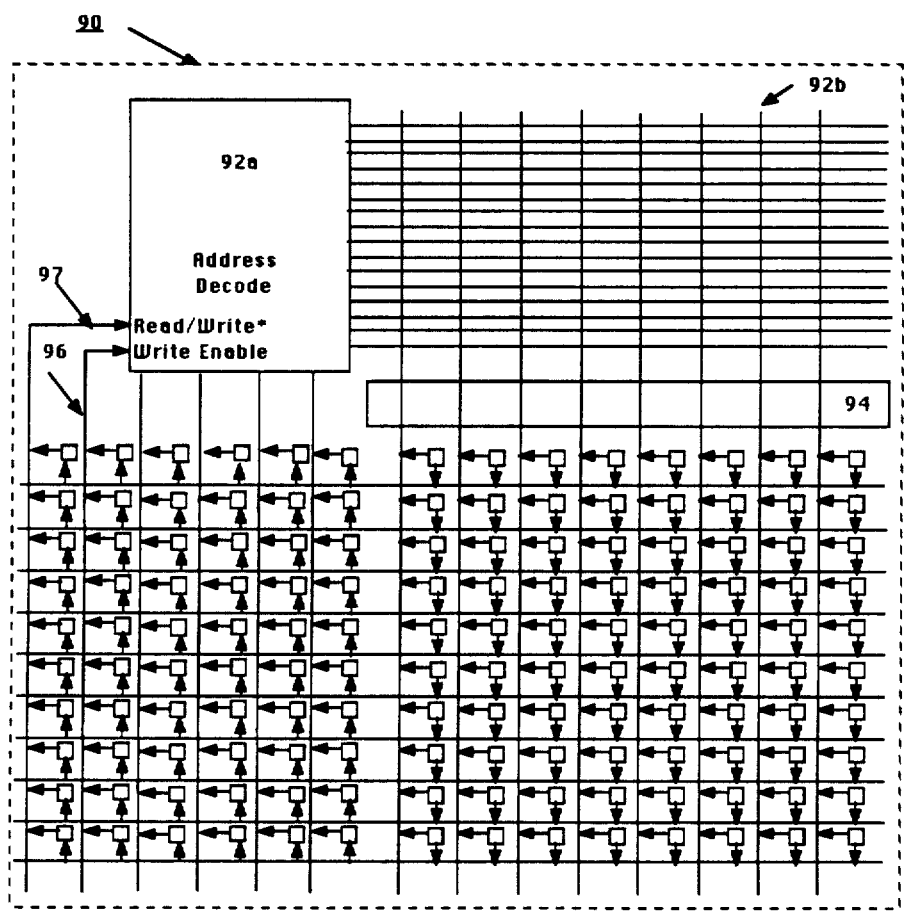
FIG. 28 is an improved Random Access Memory (RAM) using the RCC's of the present invention.

Referring to FIG. 28, there is an improved memory 90, using an array of RCC's 10 of the present invention. The improved memory 90 comprises a conventional Random Access Memory 92 which comprises an address decode section 92a and a memory section 92b. A plurality of input lines supplies the address input to the address decode 92a. A plurality of signal inputs $V_i$ is supplied to the array of RCC's 10 whose output, a plurality of $V_o$ lines is then supplied to the address decode 92a. The memory 92 also has a data bus 94 which has a plurality of data lines which supplies data to or from the memory 92b. In addition, a write-enable line 96 and a read/write* line 97 are used to control the memory 92b.

There are many advantages to the improved memory 90 of the present invention. As the scale of integration of integrated circuits increases, the risks of defects within any particular circuit also increases. With the improved memory 90, defects in the address decode section 92a can be routed around through the appropriate use of the address selection array of RCC's 10. Thus, in FIG. 28, where four address lines are shown as supplied from the RCC's 10, the address decode section 92a, if a defect occurs in one of the address decode lines 92a, the address selection array can be programmed so as to block the address selection of $V_i$ to be passed through to $V_o$. Thus, in essence, the memory addressability of the memory 92 would be reduced by one-half. Conversely, defects in the memory selection 92b may also be routed around. For example, in FIG. 28, eight data lines are shown. If a defect in a data line is detected, that line can be disabled through the use of the RCC 10. By providing more data lines than what is required (as in the case of providing eight data lines but using only 7), redundancy and flexibility increase.

Figure 29:
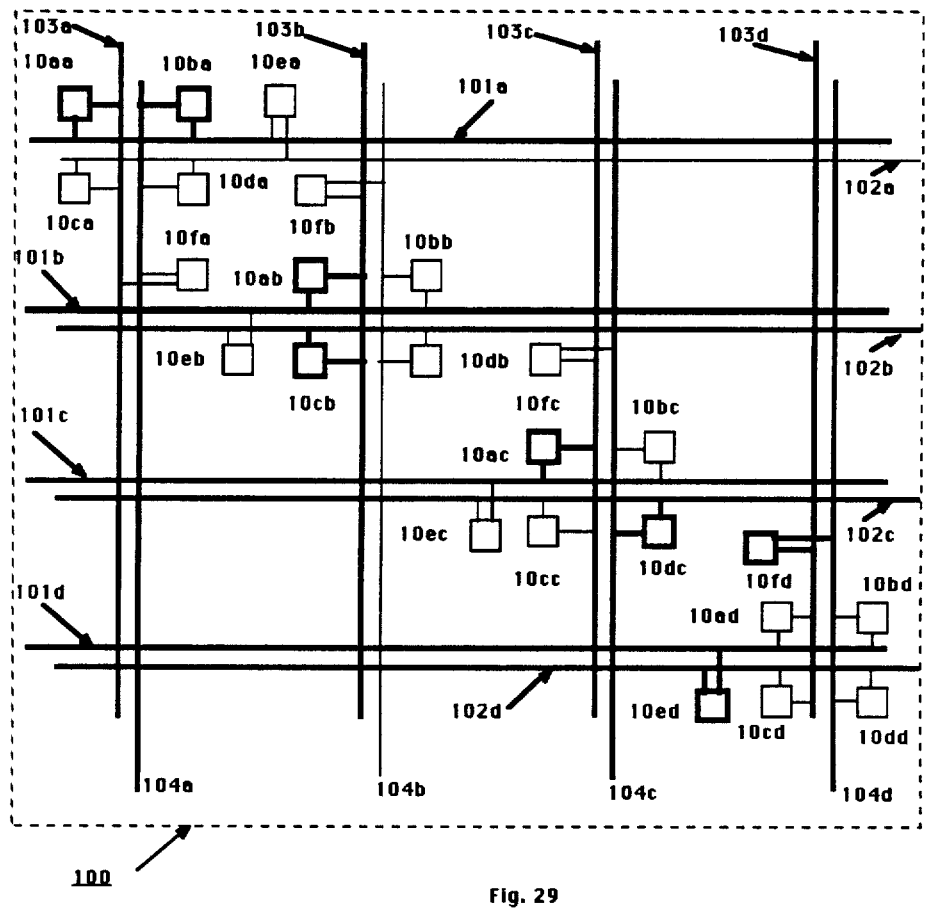
FIG. 29 is a row column input multiplexer (RCIM), using the RCC's of the present invention.

Referring to FIG. 29, there is shown a Row Column Input Multiplexer (RCIM) 100. The buss signals 101(a,b,c,d) extend to the left beyond this RCIM 100 circuit. The buss signals 102(a,b,c,d) extend to the right beyond this RCIM 100 circuit. The buss signals 103(a,b,c,d) extend to the top beyond this RCIM 100 circuit. The buss signals 104(a,b,c,d) extend to the bottom beyond this RCIM 100 circuit. The RCC's 10(ax, bx, cx, dx, ex and fx) allow any combination of connections between 101x to 102x, 103x and 104x; or 102x to 101x, 103x, and 104x; or 103x to 102x, 102x, or 104x; or 104x to 101x, 102x, 103x to be programmed (where x=a,b,c or d).

To illustrate this, note the FIG. 29: RCC's 10aa and 10ba transmission gates have been programmed to connect signals 101a, 103a and 104a. RCC's 10ab and 10cb are programmed to connect signals 101b, 102b and 103b. RCC 10ac is programmed to connect 101c and 103c. RCC10dc is programmed to connect 102c and 104c. RCC 10fd is programmed to connect 103d and 104d. RCC 10ed is programmed to connect 101d and 102d.

The advantage of the circuit 100 is that it allows for large digital circuits to be connected together in a variety of ways that can be interactively changed by reprogramming the RCC's.

Figure 30:
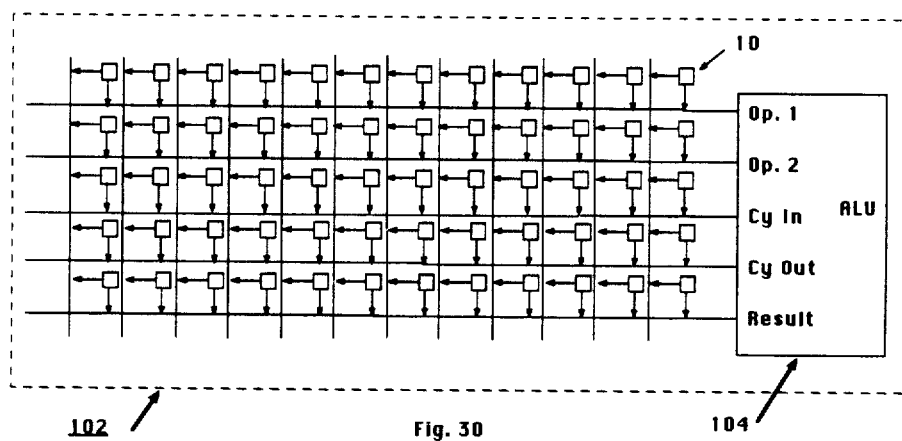
FIG. 30 is an improved ALU (Arithmetic Logic Unit), using the RCC's of the present invention.

Referring to FIG. 30, there is shown an improved ALU 102. The improved ALU 102 comprises a prior art processor ALU 104, processing one or more bits. The improved ALU 102 further comprises an array of RCC 10 which controls the routing of signals to the inputs OP.1(operand 1), OP.2(operand 2),and Cy in and the outputs Cy Out and Result. The operation code signals for the ALU 102 are assumed shared by a group of ALU 102's and will not be shown in FIGS. 30 and 31.

Figure 31:
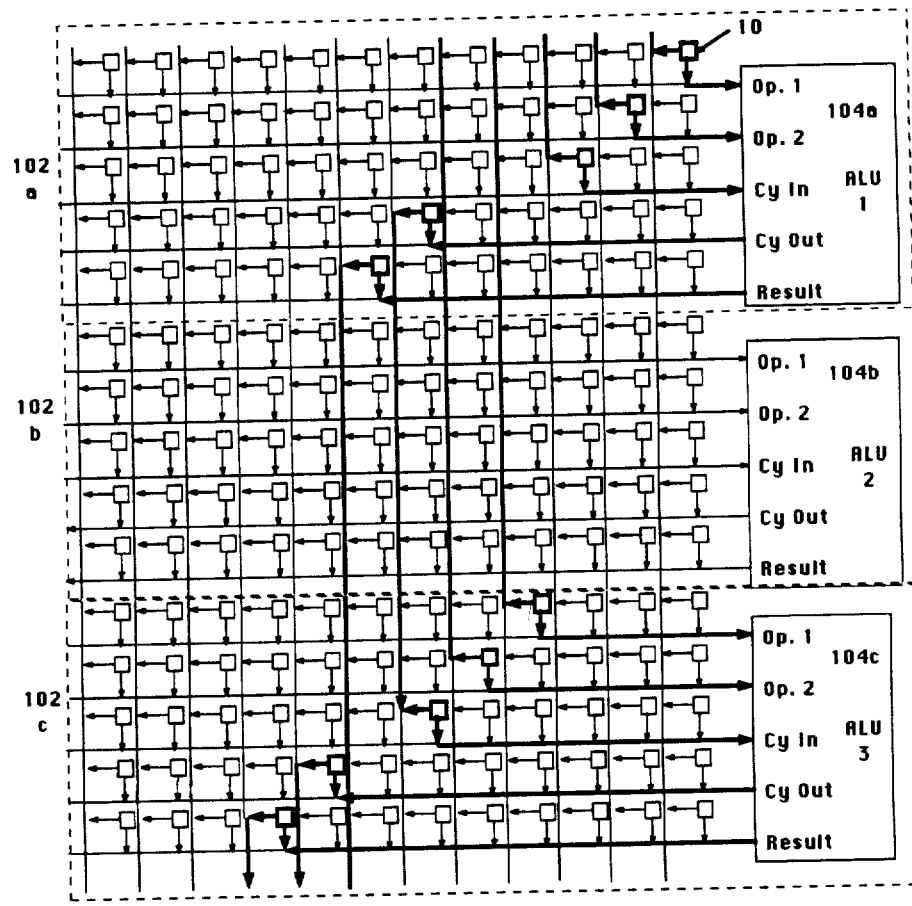
FIG. 31 is a plurality of improved ALU's, using a plurality of the RCC's of the present invention.

Referring to FIG. 31, there is shown an array of three processors 102. Each of the improved ALU processor 102 comprises elements described and shown in FIG. 30. The ALU 102, shown in FIG. 30, may disabled through the use of the RCC 10 array. Thus if ALU 102b in FIG. 31 is be disabled, the ALU 1 and ALU 3 components can be interfaced as shown in FIG. 31, so that ALU 2 is taken out of the circuit.

Referring to FIG. 31, the operation code inputs to the ALU's are treated in a manner similar to the control signals Read/Write* and Write Enable of the component 90 of FIG. 28. The signals which are routed to these inputs are controlled by an array of RCC 10's as found in FIG. 28 and also FIG. 31. These operation code inputs are shared between a set of ALUs. There may be more than one sets of ALUs sharing operation code signal control circuitry. This has the advantage of permitting the ALUs to be clustered in a multiple ALU network.

Figure 32:
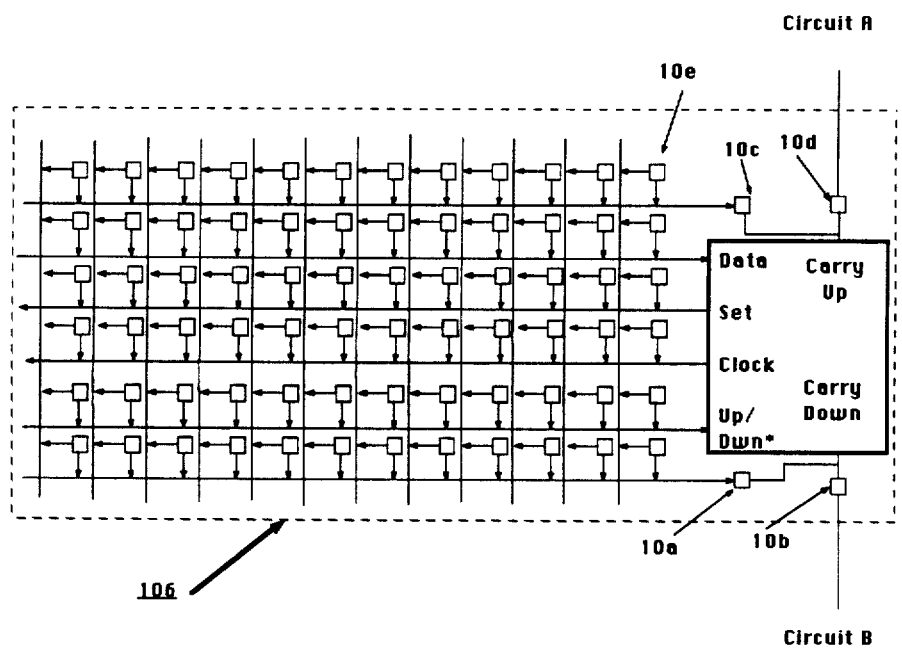
FIG. 32 is an improved counter using the RCC's of the present invention.

Referring to FIG. 32, there is shown an improved counter 106, counting one or more bits. The improved counter 106 comprises a conventional counter 108. The improved counter 106 further comprises an array of RCC 10e which controls which signals are routed to the inputs Set, Clock, Up/Down*, and the input/outputs Data, Carry Up and Carry Down. The RCC 10c and 10d control whether a signal routed from the RCC 10e array or a signal from circuit A is to be connected to the Carry Up Signal of the counter 108. The RCC 10a and 10b control whether a signal routed from the RCC 10e array or a signal from circuit B is to be connected to the Carry Down Signal of the counter 108.

Figure 33:
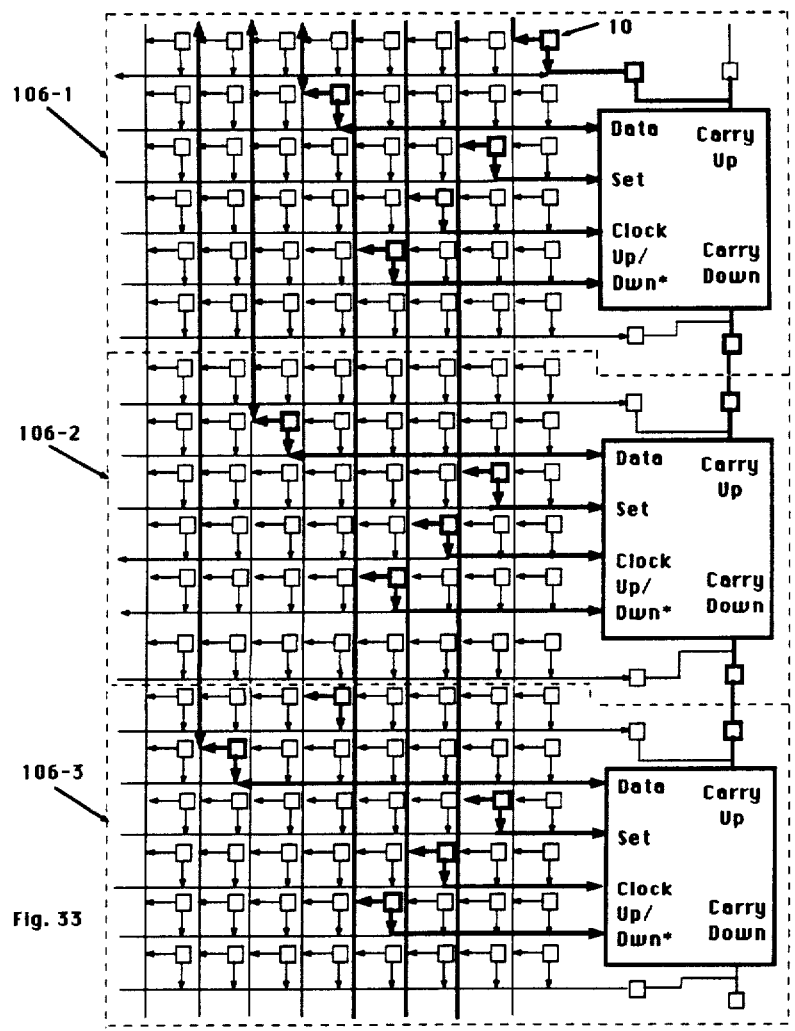
FIG. 33 is a plurality of improved counters serially connected, using the RCC's of the present invention.

The improved counter 106 can be used in an array, as shown in FIG. 33. Each of the improved counter 106 is as shown in FIG. 32. By connecting the RCC 10b of the upper circuit 106 to the RCC 10d of the lower circuit 106, the counters can be chained together to act as a larger counter. Counter 106-1 is Circuit A of FIG. 32 for counter 106-2. Counter 106-2 is Circuit B of FIG. 32 for counter 106-1. Counter 106-2 is Circuit A of FIG. 32 for counter 106-3. Counter 106-3 is Circuit B of FIG. 32 for counter 106-2. The advantages of this improved counter 106 are that an array utilizing these improved counters can either act as a large counter or as a collection of independent counters whose inputs can be programmed.

Figure 34:
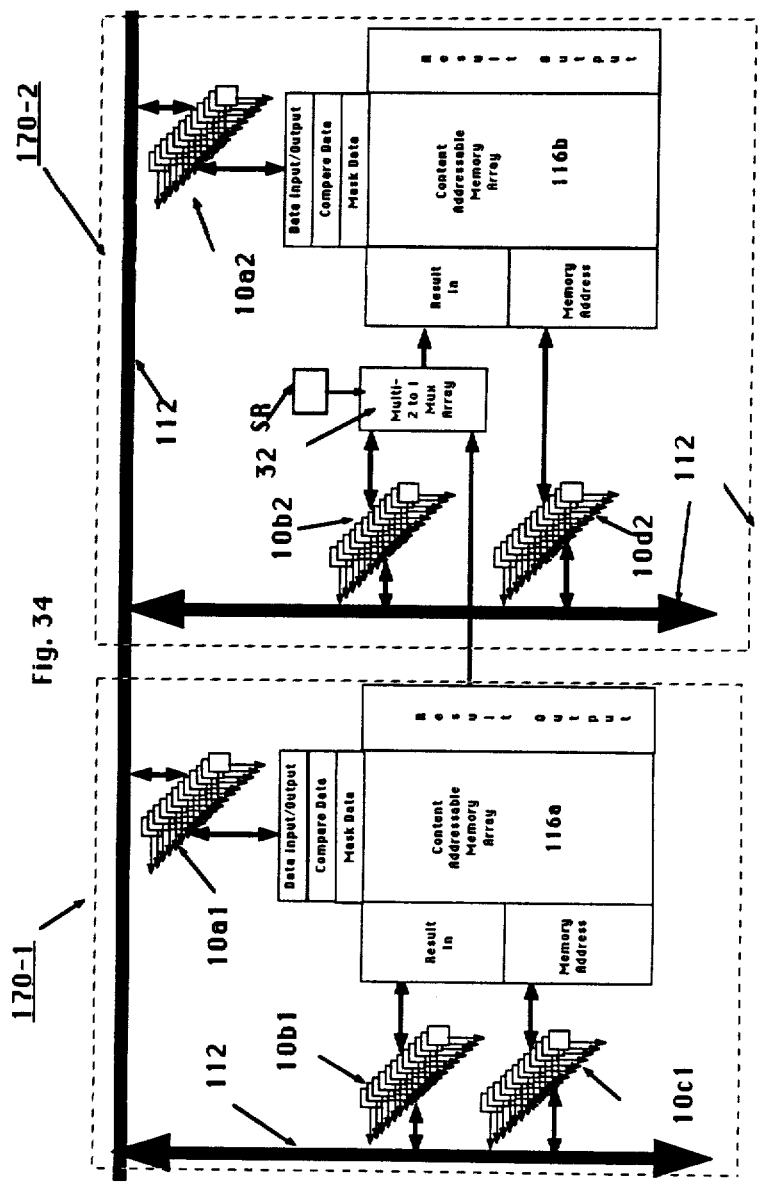
FIG. 34 is a schematic diagram of an improved CAM (Content Addressable Memory), using the RCC's of the present invention.

Referring to FIG. 34, there is shown two instances of an improved content addressable memory 170. The improved CAM 170 comprises a data bus 112, having a plurality of signal lines. The improved CAM 170 also has a plurality of prior art content addressable memory 116. Each of the CAM 116 of the prior art has data signals, address input signals, result input signals and result output signals. In the improved CAM 170, signals from the data buss 112 are supplied to an array 10c of RCC. From the RCC 10c array, the output signals are supplied to the address input of the CAM 116. The data buss 112 is supplied to an array 10a of RCC, whose output is supplied to the Compare Data and Mask Data Registers. The data buss 112 is supplied to the array 10b of RCC. The output of the second array 10b1 of RCC is supplied to the result input of the CAM 116a. The output of the second array 10b2 of RCC is supplied to the 2-1 Mux(Multiplexer) Array, which is controlled by a single Shift Register. The other input to the 2-1 MUX array is the result output signals of CAM 116a. The outputs of the 2-1 MUX array are supplied as the result inputs of the CAM 116a. Additional CAM's 116 may be added in succession in the manner shown and described.

With the improved CAM 170, if it were desired to search for a field larger than the width of data contained in a single CAM 116, the two CAM 116's can be operated in parallel- as if the field of data to be search were twice as large as a single CAM 116. The improved CAM 170 can be operated such that the result from CAM 116a is passed to the adjacent CAM 116b. It should be noted that the time it will take to search multiple CAM's 116 arranged in this manner is approximately as long as it would take to search through the entire memory contents of a single CAM 116—even though all the memory of two or more CAM 116's is being searched. This is because the operation of matching the data occurs in both of the CAM 116's simultaneously and the result is passed on from one CAM 116 to the other. It should be noted that the arrays 10a(1,2), 10b(1,2) and 10c(1,2) are identical in structure to the arrays of RCC's 10 in diagrams 32 and 32a.

Figure 35:
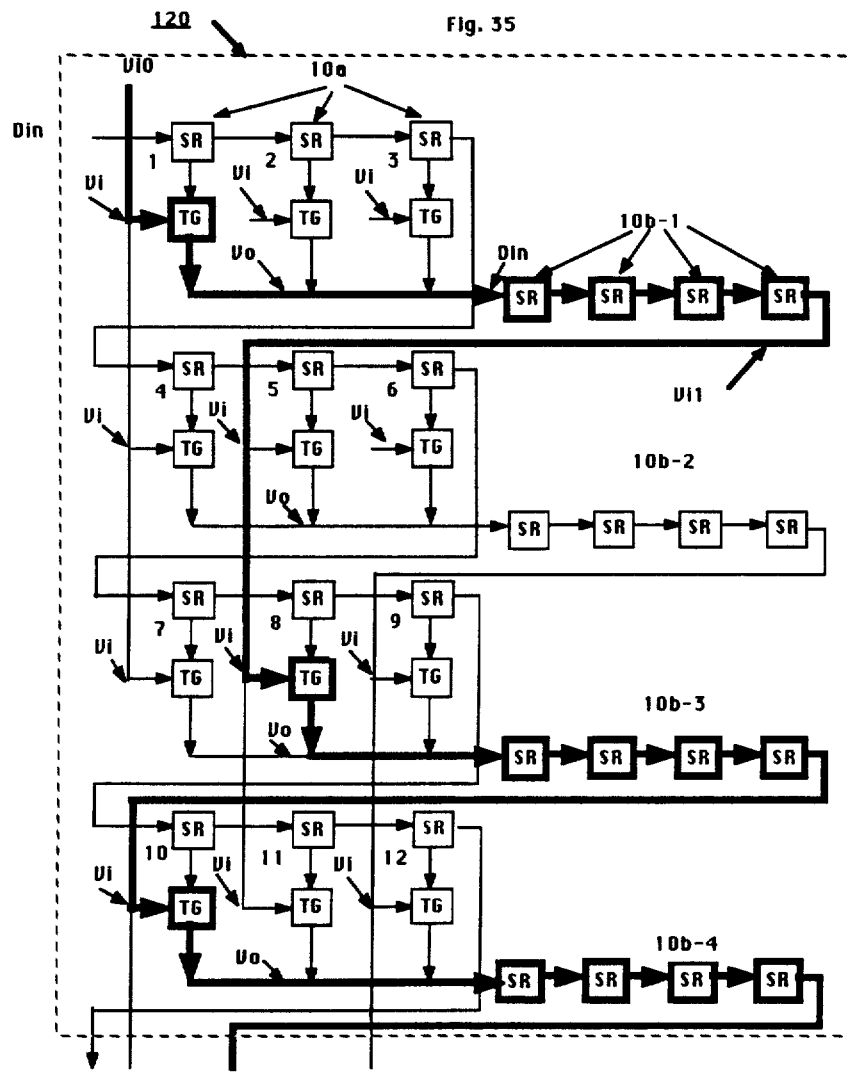
FIG. 35 is a schematic block diagram of a plurality of the RCC's of the present invention used for redundancy and to selectively route signal and/or power paths.

Referring to FIG. 35, there is shown a path connection network circuit 120. The PCN 120 comprises a first array 10a and a second array 10b of RCC. Twelve(12) RCC's 10 are shown for the first array 10a (labelled 1-12). The second arrary 10b is shown as having 4 groups of RCC 11b (labelled 10b-1, 10b-2, 10b-3 and 10b-4).

The data to program the RCC's of the first array 10a are supplied to each of the RCC 10a serially. The data to program the RCC's of the second array 10b are supplied as $V_i$ to the first array 10a of RCC. Thus, the data to program the RCC's of the first array 10a determine which $V_i$ signal (data for programming the second array 10b) would reach the second array 10b of RCC.

Let us assume that a "1" stored in a shift register in array 10a causes the transmission gate (labelled TG) to transmit data. So that a "0" would inhibit data transmission in that transmission gate. In the operation of the PCN 120, data would first be loaded into the shift registers SR of the first array 10a of RCC. Thus, for the PCN 120 shown in FIG. 35, data would be loaded into the shift registers such that "1" would be stored in RCC 10a-1, 10a-8 and 10a-10; and "0" stored in RCC's 10a-2, 10a-3, 10a-4, 10a-5, 10a-6, 10a-7, 10a-9, 10a-11 and 10a-12. Thereafter, the data from the second array 10b would be loaded as $V_i$ to the first array 10a of RCC.

Since $V_{i0}$ is input to RCC 10a-1, 10a-4 and 10a-7, but only RCC 10a-1 has a "1" stored serially therein, the data flows to the output $V_o$ RCC 10a-1. The serial data output of the RCC 10b-1 shift registers, $V_{i1}$, is also supplied as $V_i$ to RCC 10a-5, 10a-8 and 10a-11.

If now a failure or defect occurs in a RCC 10b, the PCN 120 can be programmed to route around that failure. For example, suppose the RCC 10b-2 has a failure. Since only RCC 10a-8 is storing a "1", the output of the serial shift registers in 10b-1 becomes the input to the RCC 10b-3. The output of the shift registers 10b-3 is routed to the input of 10b-4 by RCC 10a-10 storing a "1".

The advantage of having the PCN 120 of the present invention is that as integration increases, even the RCC 10 of the present invention are not immune from defects during manufacturing. Thus, if a defect occurs in RCC 10b, that defect can be routed around by reprogramming RCC 10a. However, if a defect occurs in RCC 10a, then that may be fatal. But statistically, an error in RCC 10a is unlikely because there would be far fewer RCC 10a than the total number of RCC 10b. The PCN 120 can be used to reroute data or even power.

Figure 36:
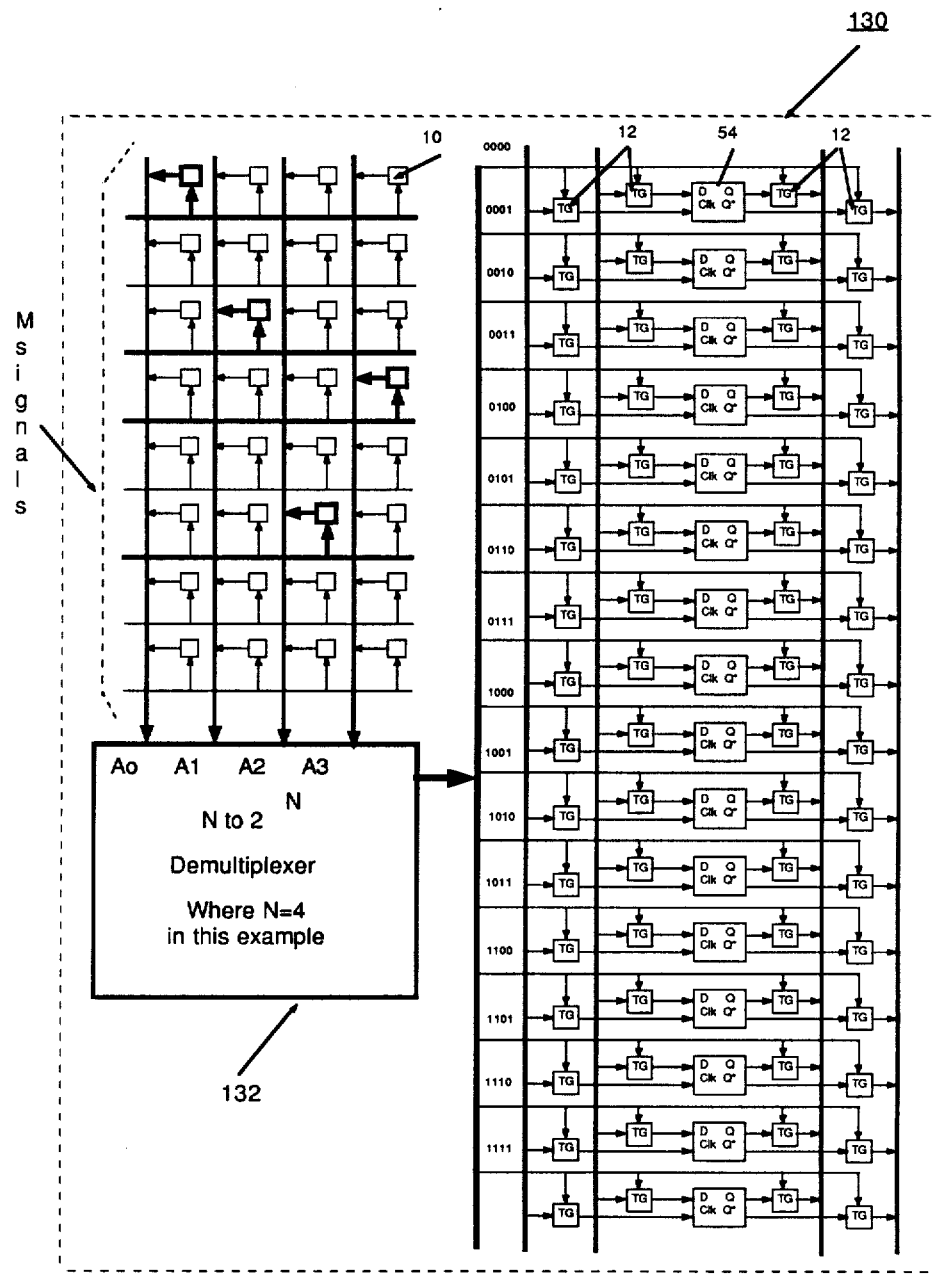
FIG. 36 is a plurality of the RCC's of the present invention used to control flip-flops.

Referring to FIG. 36, there is shown a flip-flop switching circuit 130. The circuit 130 comprises a plurality of RCC's 10. M inputs lines supply the input signal $V_i$ to the RCC 10. N output lines are from the RCC 10 supplying $V_o$ output signal. (M is greater than N). The N output signals are supplied to a N to $2^N$ demultiplexer 132. From the demultiplexer 132, $2^N$ output signals are available. Each of the $2^N$ outputs of the demultiplexer 132 is supplied to a plurality of transmission gates 12 (labelled TG) Four are shown in FIG. 36 connected to each output signal of the demultiplexer 132. The plurality of transmission gates 12 (labeled TG) associated with each output signal are associated with a single flip-flop 54. Two of the transmission gates TG receive signals and supply signals to D and CLK of the flip-flop 54. The flip-flop 54 has Q and Q* outputs which are supplied to the other two transmission gates 12. These transmission gates 12 are also controlled by the line from one of the outputs of the demultiplexer 132.

In the operation of the circuit 130, the state of a flip-flop 54 at any point in time can be preserved as processing is passed to another section of an integrated circuit using different flip-flops 54. Thereafter, if the processing were to resume on the original flip-flop, that original state may be easily and quickly retrieved. Thus, for example, if there were two flip-flops 54 and one flip-flop is used to store data or program in the operation of the circuit in one state. If that program were interrupted, that information is preserved during the time processing is taken over by the second flip-flop. Thereafter, if the task associated with the second flip-flop were finished, processing may be resumed with the first task with the associated first flip-flop. The transmission gate 12 associated with each flip-flop permits selective control of the output of the flop-flop that is to be used in other parts of the circuit. As for the use of the RCC 10 and the demultiplexer 132, it can be seen that, by using a few input signals, a larger number of control signal states can be maintained.

Figure 37:
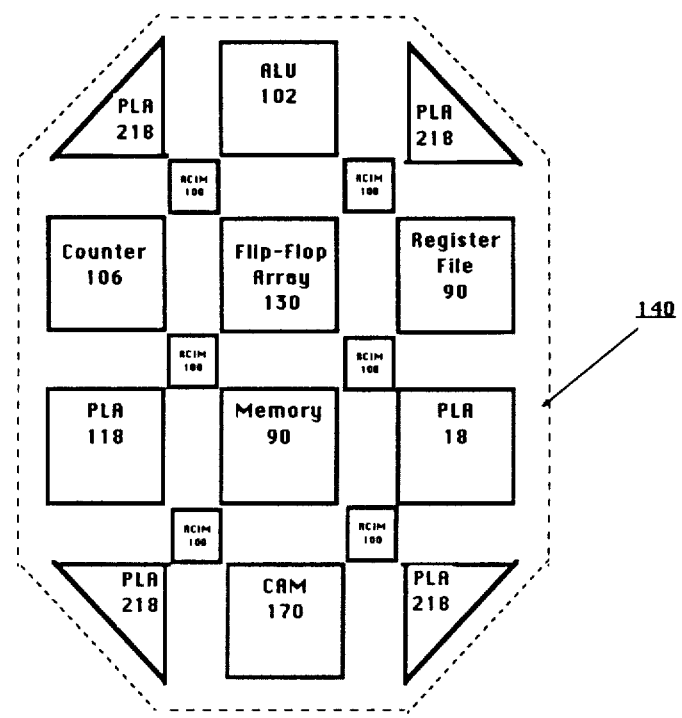
FIG. 37 is a block diagram of a wafer-scale integrated circuit using ALU, PLA, memory, RCIM, flip-flops and registers with the RCC's of the present invention.

Referring to FIG. 37, there is shown an illustrative diagram of a wafer scale integrated circuit 140 of a layout of a processor and its associated circuitry. Such a wafer scale integrated circuit can be fabricated on approximately a substantially circular die wafer. The wafer scale integrated processor 140 comprises the improved PLA 218, which are substantially triangularly-shaped in the corners of the wafer. Other rectangularly shaped areas may be the improved PLA 18 or 118. The processor 140 also comprises the improved processor 102, the improved counters 106, the improved flip-flops 130, the improved memory 90 and the improved CAM 170. These are all substantially rectangularly shaped. Between each of these circuits are RCIM 100, Surrounding the processor 140 would be PCN 120. With the foregoing features, it is believed that even fabrication defects in wafer scale integration can be routed around using the RCC 10 of the present invention, as shown and described heretofore. It should be recognized that, with the RCC 10 of the present invention, reliability is increased and reprogrammability is achieved.

I claim:

1. An integrated circuit comprising:
    a bit shift register for serially receiving and storing a serial bit signal, and having a control output signal; said control signal represents the state of the serial input bit signal stored in said register; and
    a transmission gate means for receiving an input signal and said control signal and having an output signal, said transmission gate means for transmitting said input signal to said output signal as controlled by said control signal.

2. The circuit of claim 1 further comprising:
    a plurality of bit shift registers, each bit register having a serial output bit signal and receiving a serial input bit signal from the serial output bit signal of another shift register; and
    a plurality of transmission gate means each gate means being controlled by one serial bit shift register.

3. The circuit of claim 2 wherein each transmission gate means is an AND gate, NOR gate, NAND gate or Exclusive OR gate.

4. The circuit of claim 2 wherein each transmission gate means is a transmission gate.

5. The circuit of claim 2 comprising:
    a first array of logic gates, said first array having a plurality of inputs and a plurality of outputs; and
    outputs signals of said transmissions gate means are supplied to the inputs of said first array.

6. The circuit of claim 5 further comprising:
    a second array of logic gates, said second array having a plurality of inputs and a plurality of outputs;
    output signals of said transmission gate means are supplied to the inputs of said second array; and
    said first array and said second array have substantially the same physical shape.

7. The circuit of claim 6 wherein each of said arrays of logic gates and transmission gate means is substantially in the physical shape of a hexagon.

8. The circuit of claim 6 wherein each of said arrays of logic gates and transmission gate means is substantially in the physical shape of a right triangle and wherein two said arrays of logic gates and transmission gate means are positioned to form a rectangle.

9. The circuit of claim 5 wherein said first array further comprises:
    a plurality of groups of logical AND gates;
    a plurality of logical OR gates; and
    the output of each AND gate is connected to the input of a logical OR gate.

10. The circuit of claim 9 wherein each logical AND gate is programmably connected to an input of more than one logical OR gate.

11. The circuit of claim 10 further comprising:
a second plurality of bit shift registers, each for serially receiving and storing a serial input bit signal and having a serial output bit signal and a control signal, the serial input bit signal connected to the serial output bit signal of another bit shift register; said control signal is the stored serial input bit signal in said serial bit shift register; and
a plurality of transmission gate means, each gate means being controlled with a bit shift register and for transmitting an output of the first plurality of AND gates to an input of an OR gate in the second plurality as controlled by said control signal of the bit shift register.

12. The circuit of claim 5 wherein said first array further comprises:
a plurality of groups of logical NOR gates;
a second plurality of logical NOR gates;
the output of a NOR gate of the first plurality of NOR gates is connected to an input of a NOR gate of the second plurality of NOR gates.

13. The circuit of claim 12 wherein each input of said array is programmably connected to an input of a NOR gate of the first plurality of NOR gates.

14. The circuit of claim 12 wherein each output of each of logical NOR gates of the first plurality of NOR gates is programmably connected to an input of more than one logical NOR gate of the second plurality of NOR gates.

15. The circuit of claim 14 further comprising:
a second plurality of bit shift registers, each for serially receiving and storing a serial bit signal and having a serial output bit signal and a control signal, the serial input bit signal connected to the serial output bit signal of another bit shift register; said control signal is the stored state of serial input bit signal in said bit shift register; and
a plurality of transmission gate means, each gate means being controlled by a bit shift register and for transmitting the output of a NOR gate of the first plurality of NOR gates to an input of a NOR gate in the second plurality as controlled by said control signal.

16. The circuit of claim 15 further comprising:
a plurality of logical exclusive OR gates, each having two inputs and one output and a plurality of serial bit shift registers, for serially receiving and storing a serial bit signal, having a control output signal and having a serial output bit signal; said control signal represents the state of the serial input bit signal stored in said register; one input of each exclusive OR gate is the output of a NOR gate of the first plurality of NOR gates, the other input of that exclusive OR gate is the control output signal of a serial bit shift register;
a plurality of transmission gate means, each transmission gate means of the third plurality controlled by a serial bit shift register of the third plurality of serial bit shift registers; said control signal generated by the bit shift register is the state of the serial input bit signal stored in said register; the control signals of a bit shift register is connected to the control input of the transmission gate means; the input of the transmission gate means is connected to the output of a NOR gate of the first plurality of NOR gates; the output of the transmission gate means is connected to the input of a NOR gate of the second plurality of NOR gates as controlled by said control signal.

17. The circuit of claim 2 further comprising:
a read/write memory having a plurality of input address lines and a plurality of data lines;
each output signal of a transmission gate means of the first group is connected to an input address line and each output signal of a transmission gate means of the second group is connected to a data line; and
each input signal of each transmission gate means of the first group provides the input address to said memory and each transmission gate means of the second group controlling the data to and from said memory.

18. The circuit of claim 2 wherein the output signal of all transmission gate means are connected together and where said plurality of transmission gate means comprises two groups, a first group and a second group, each of said first group of transmission gate means for receiving a signal of a row as its input signal, and each of said second group of transmission gate means for receiving a signal of a column as its input signal.

19. The circuit of claim 2 further comprising:
a processor having a plurality of input lines including clock, operand and carry-in, and a plurality of output lines including data and carry-out;
each output signal of a transmission gate means of the first group is connected to an input line and each input signal of a transmission gate means of the second group is connected to an output line; and
each input signal of each transmission gate means of the first group provides the input to said processor and each output signal of each transmission gate means of the second group provides an output of said processor.

20. The circuit 19 further comprising:
a plurality of processors, each having a plurality of input lines and a plurality of output lines.

21. The circuit of claim 2 further comprising:
a counter having a plurality of inputs lines including data, set, pulse, count up, and count down and a plurality of output lines including carry up and carry down and data-out;
each input signal of a transmission gate means of the first group is connected to an input line and each input signal of a transmission gate means of the second group is connected to an output line; and
each output signal of each transmission gate means of the first group provides an input to said counter, and each output signal of each transmission gate means of the second group provides an output of said counter.

22. The circuit of claim 20 further comprising:
a plurality of counters with the output signal of some of the transmission gate means of the second group connected to another counter.

23. The circuit of claim 2 further comprising:
a content addressable memory, having data input lines, data output lines, address input lines, result output lines and result input lines;
an input data bus comprising a plurality of input lines;
an output data bus comprising a plurality of output lines;
an address bus comprising a plurality of address lines;
a first group of a plurality of transmission gate means, each having an input signal connected to said input data bus and an output signal connected to said data input lines;
a second group of a plurality of transmission gate means, each having an input signal connected to said address bus and an output signal connected to said address input lines; and
a third group of a plurality of transmission gate means, each having an input signal connected to said data output lines and an output signal connected to said output data bus.

24. The circuit of claim 23 further comprising:
a plurality of content addressable memories and
a fourth group of transmission gate means, each having an input connected to a result output line of one content addressable memory word and an output signal connected to a result input line of another content addressable memory word;
a serial bit shift register whose control output is connected to the control input of each transmission gate means of the fourth plurality of transmission gate means.

25. The circuit of claim 2 further comprising:
an N input to $2^N$ output demultiplexer;
the outputs of said transmission gate means are connected to the inputs of the N input to $2^N$ output demultiplexer; a plurality of flip-flops, each having a data input and an output;
for each of the flip-flops in said plurality, there is a transmission gate means for receiving a logic signal whose control input is connected to one of the $2^N$ outputs of the demultiplexer and whose output is connected to the data input of the flip-flop; and
for each of the flip-flops in said plurality, there is a transmission gate means whose control input is connected to an output of the $2^N$ demultiplexer, and whose input is connected to the output of the flip-flop, whereby one of the outputs of the demultiplexer controls the output of the flip-flop.

26. The circuit of claim 2 further comprising:
a first group of bit shift registers and an associated transmission gate means, and a second group of bit shift registers and an associated transmission gate means;
means for connecting the output signal of a plurality of transmission gate means of the first group to the serial bit signal of the bit shift registers of the second group;
means for connecting the input signal of a plurality of transmission gate means of the first group to the serial output bit signal of the bit shift registers of the second group;
whereby serial input bit signals stored in the shift registers of the first group act to connect certain serial input signals of the shift registers of the second plurality to certain serial output signals of the shift registers of the second group.

* * * * *